US012183986B2

(12) United States Patent
Kalateh et al.

(10) Patent No.: US 12,183,986 B2
(45) Date of Patent: Dec. 31, 2024

(54) ELECTRONICALLY RECONFIGURABLE 2-BIT PHASE QUANTIZATION PHASED ARRAY ELEMENT

(71) Applicant: Wisconsin Alumni Research Foundation, Madison, WI (US)

(72) Inventors: Mohammad Mahdi Honari Kalateh, Middleton, WI (US); Nader Behdad, Oregon, WI (US); John H. Booske, McFarland, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 432 days.

(21) Appl. No.: 17/568,015

(22) Filed: Jan. 4, 2022

(65) Prior Publication Data
US 2023/0216191 A1    Jul. 6, 2023

(51) Int. Cl.
*H01Q 3/00*    (2006.01)
*H01Q 3/36*    (2006.01)
(Continued)

(52) U.S. Cl.
CPC .............. *H01Q 3/36* (2013.01); *H01Q 3/46* (2013.01); *H01Q 1/48* (2013.01); *H01Q 9/0407* (2013.01); *H01Q 19/10* (2013.01); *H03H 7/18* (2013.01)

(58) Field of Classification Search
CPC .............. H01Q 3/36; H01Q 3/30; H01Q 3/44; H01Q 3/46; H01Q 1/48; H01Q 9/0407; H01Q 19/10; H03H 7/18
(Continued)

(56) References Cited

U.S. PATENT DOCUMENTS

| 6,081,235 A * | 6/2000 | Romanofsky | H01Q 3/46 333/156 |
| 6,351,240 B1 * | 2/2002 | Karimullah | H01Q 9/0421 343/846 |

(Continued)

FOREIGN PATENT DOCUMENTS

| CN | 109818155 A * | 5/2019 | .............. H01Q 19/10 |
| CN | 116169477 A * | 5/2023 | ............... H01Q 3/30 |

(Continued)

OTHER PUBLICATIONS

K. Miyaguchi et al., "An ultra-broad-band reflection-type phase-shifter MMIC with series and parallel LC circuits," IEEE Transactions on Microwave Theory and Techniques, vol. 49, No. 12, pp. 2446-2452, Dec. 2001.

(Continued)

*Primary Examiner* — Chuong P Nguyen
(74) *Attorney, Agent, or Firm* — Bell & Manning, LLC

(57) ABSTRACT

A phase shift element includes an antenna, a first dielectric layer, a ground plane mounted to a first surface of the first dielectric layer, a reflecting circuit, and a single antenna-reflector line connected between the antenna and the reflecting circuit through the ground plane and the first dielectric layer. The antenna-reflector line is formed of a conducting material. The reflecting circuit is mounted to a second surface of the first dielectric layer. The first surface is opposite the second surface. The reflecting circuit is configured to reflect a signal received on the single antenna-reflector line from the antenna back to the antenna on the single antenna-reflector line. The reflecting circuit is further configured to be switchable between four different impedance levels that each provide a different phase shift when the signal is reflected by the reflecting circuit.

20 Claims, 15 Drawing Sheets

(51) Int. Cl.
*H01Q 3/46* (2006.01)
*H01Q 1/48* (2006.01)
*H01Q 9/04* (2006.01)
*H01Q 19/10* (2006.01)
*H03H 7/18* (2006.01)

(58) Field of Classification Search
USPC .................................................. 342/372, 368
See application file for complete search history.

(56) References Cited

U.S. PATENT DOCUMENTS

| | | | |
|---|---|---|---|
| 6,741,207 | B1 | 5/2004 | Allison et al. |
| 7,030,824 | B1 | 4/2006 | Taft et al. |
| 7,224,314 | B2 * | 5/2007 | Lee .......................... H01Q 3/46 |
| | | | 343/700 MS |
| 8,248,302 | B2 | 8/2012 | Tsai et al. |
| 9,640,867 | B2 | 5/2017 | Behdad et al. |
| 10,090,603 | B2 | 10/2018 | Behdad et al. |
| 10,749,270 | B2 | 8/2020 | Behdad et al. |
| 10,862,210 | B2 | 12/2020 | Behdad et al. |
| 11,205,828 | B2 * | 12/2021 | Behdad ................... H01P 1/182 |
| 11,239,555 | B2 * | 2/2022 | Behdad ..................... H01Q 3/46 |
| 11,973,274 | B2 * | 4/2024 | Theofanopoulos .... H01Q 3/247 |
| 2006/0109176 | A1 | 5/2006 | Lee |
| 2008/0030420 | A1 | 2/2008 | Lee |
| 2009/0027138 | A1 | 1/2009 | Nishino et al. |
| 2019/0348768 | A1 * | 11/2019 | Behdad ................. H01Q 15/248 |
| 2020/0243968 | A1 * | 7/2020 | Behdad ................. H01Q 15/22 |
| 2023/0216193 | A1 * | 7/2023 | Kalateh ................. H01Q 19/10 |
| | | | 343/754 |

FOREIGN PATENT DOCUMENTS

| | | | | |
|---|---|---|---|---|
| JP | 2006174144 A | * | 6/2006 | ............... H01Q 3/36 |
| KR | 20230028138 A | * | 2/2023 | ............... H01Q 3/26 |

OTHER PUBLICATIONS

Non-Final Office Action in U.S. Appl. No. 17/567,965 dated Apr. 25, 2024, 9 pages.

* cited by examiner

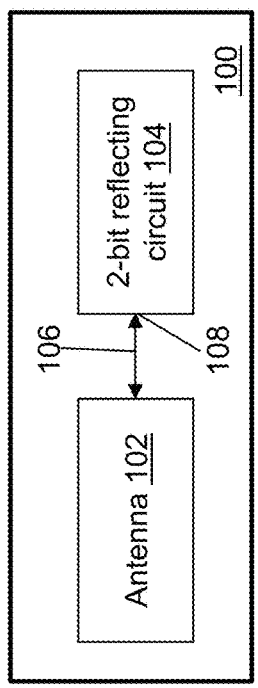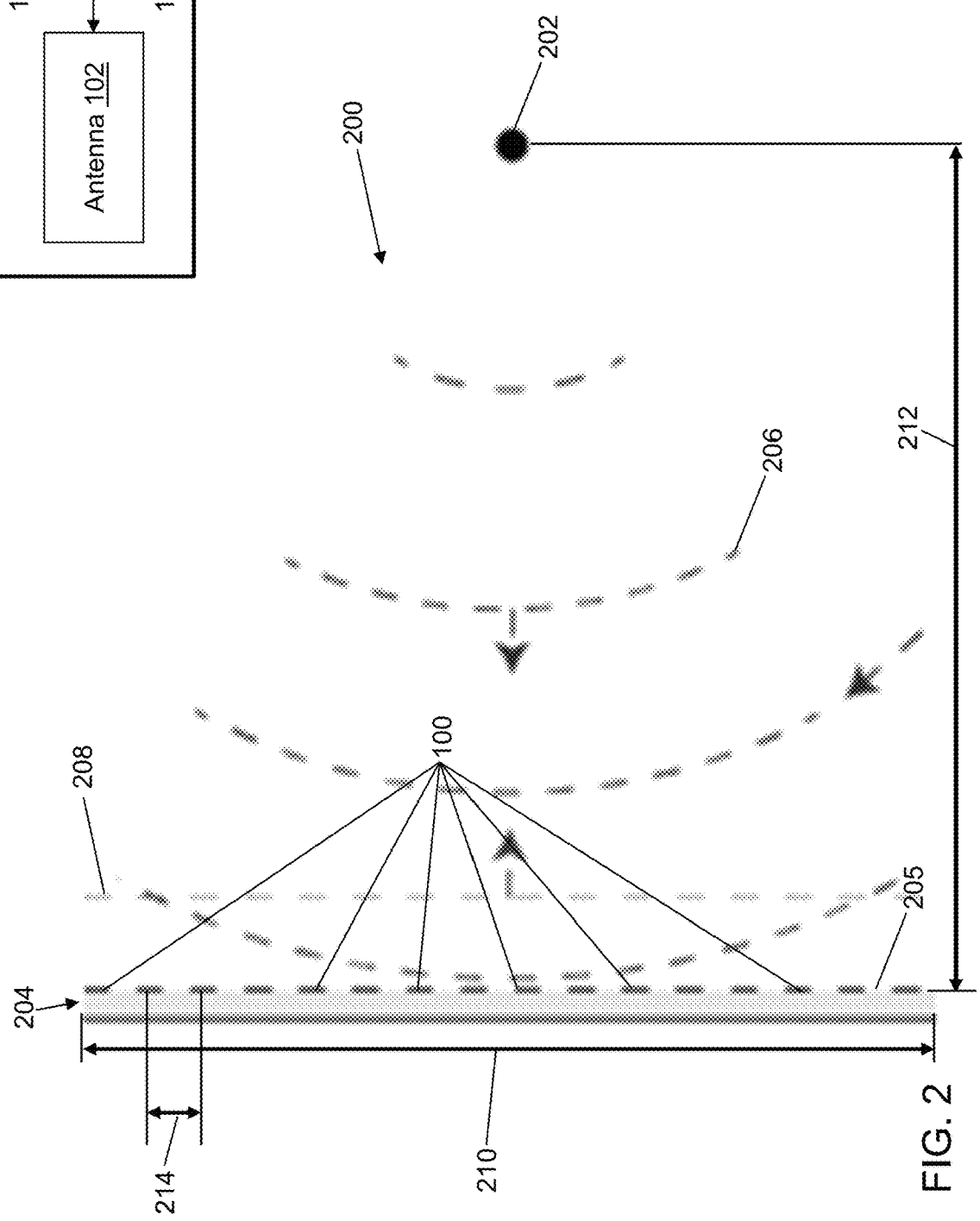

ELECTRONICALLY RECONFIGURABLE 2-BIT PHASE QUANTIZATION PHASED ARRAY ELEMENT

REFERENCE TO GOVERNMENT RIGHTS

This invention was made with government support under N00014-19-1-2502 awarded by the NAVY/ONR. The government has certain rights in the invention.

BACKGROUND

A phased-array antenna is an array of antennas in which a relative phase of signals feeding each antenna is varied such that an effective radiation pattern of the array is reinforced in a desired direction and suppressed in undesired directions to provide electronic steering of a beam. Electronically tunable reflective array (reflectarray) antennas may be used in designing passive phased-array antennas used in applications ranging from wireless and satellite communications to radar and imaging systems. Reflectarray antennas are typically used to collimate the wave front generated by a low-gain feed antenna. Each unit cell of the reflectarray antenna acts as a spatial phase shifter to scatter the incident wave with a specific phase shift to realize a desired phase profile for the reflected wave over the array's aperture to form a high gain pencil beam at an intended direction. Beams are formed in the intended direction by shifting the phase of the signal emitted from each radiating element to provide either constructive or destructive interference to steer the beam. The direction of the main beam can be electronically steered by adaptively changing the reflection phase of each array element.

Ideally, it is desirable to have the reflectarray antenna's unit cells that can be reconfigured to yield any arbitrary phase shift values between 0° and 360° to provide perfect phase correction. However, the reconfiguration techniques to achieve any arbitrary phase shift values between 0° and 360° require changing the control voltage continuously and individually configuring the unit cells, which results in a relatively sophisticated architecture for voltage supply circuitry. Moreover, it is challenging to realize the full, reconfigurable 0° to 360° phase range over a broad frequency range (e.g., with fractional bandwidth of larger than 10%). Instead of a continuous 0° to 360° phase range, discrete phase correction schemes that quantize this phase range into a number of discrete levels have been widely adopted in order to reduce the complexity of the control circuitry and increase operating bandwidths of beam-steerable reflectarray antennas.

Electronically reconfigurable reflectarray antennas typically use multiple semiconducting devices (e.g., PIN diode switches, varactor diodes, etc.) embedded within the reflectarray unit cell to achieve electronic reconfigurability. In a typical phased-array antenna, hundreds or thousands of unit cells are needed. This increases the number of semiconducting components required for the phased-array aperture, thereby increasing its cost and complexity.

Another challenge of electronically-tunable reflectarray antennas is the limited bandwidth offered by most conventional designs. Typical designs have bandwidths in the order of 10%. In many future wireless applications where significant bandwidth and throughput is required, this narrow bandwidth may be insufficient to meet the demands of the system.

SUMMARY

In an illustrative embodiment, a phase shift element is provided. The phase shift element includes, but is not limited to, an antenna, a first dielectric layer, a ground plane mounted to a first surface of the first dielectric layer, a reflecting circuit, and a single antenna-reflector line connected between the antenna and the reflecting circuit through the ground plane and the first dielectric layer. The antenna-reflector line is formed of a conducting material. The reflecting circuit is mounted to a second surface of the first dielectric layer. The first surface is opposite the second surface. The reflecting circuit is configured to reflect a signal received on the single antenna-reflector line from the antenna back to the antenna on the single antenna-reflector line. The reflecting circuit is further configured to be switchable between four different impedance levels that each provide a different phase shift when the signal is reflected by the reflecting circuit.

In another illustrative embodiment, a phased array antenna is provided. The phased array antenna includes, but is not limited to, a plurality of phase shift elements.

Other principal features of the disclosed subject matter will become apparent to those skilled in the art upon review of the following drawings, the detailed description, and the appended claims.

BRIEF DESCRIPTION OF THE DRAWINGS

Illustrative embodiments of the disclosed subject matter will hereafter be described referring to the accompanying drawings, wherein like numerals denote like elements.

FIG. 1 depicts a block diagram of a 2-bit phase shift element in accordance with an illustrative embodiment.

FIG. 2 depicts a side view of a transceiver system that includes a plurality of the 2-bit phase shift elements of FIG. 1 in accordance with an illustrative embodiment.

DETAILED DESCRIPTION

Referring to FIG. 1, a 2-bit phase shift element 100 is shown in accordance with an illustrative embodiment. 2-bit phase shift element 100 may include an antenna 102 and a reflecting circuit 104. Antenna 102 and reflecting circuit 104 may be connected using an antenna-reflector line 106 that connects to reflecting circuit 104 at an input/output (I/O) port 108 of reflecting circuit 104. A signal may be received at I/O port 108 from antenna-reflector line 106 that is reflected by reflecting circuit 104 back onto antenna-reflector line 106 such that I/O port 108 provides a port of entry of a received electrical signal and of exit of a reflected electrical signal. Reflecting circuit 104 can be configured to provide four different reflection loads. When antenna 102 is illuminated with an incident electromagnetic wave, a signal that results from the wave is entirely reflected by reflecting circuit 104 with a phase shift that can be adjusted electronically to four different phase shifts, such as 0°, 90°, 180°, and 270°, by controlling a state of switches of reflecting circuit 104 and thereby changing the impedance of reflecting circuit 104.

Antenna 102 can be any type of antenna or radiating element including, but not limited to, a microstrip patch antenna, a slot and aperture-coupled antenna, a monopole antenna, a dipole antenna, or any combination of them. In the illustrative embodiment, antenna 102 is a 1-port antenna though a 2-port antenna, such as an antenna with a differential feed structure, can be used when one of the ports is left open or shorted. Antenna-reflector line 106 may be a wire, a trace, a vertical interconnect access, or any other means of direct electrical connection.

Figure 3:
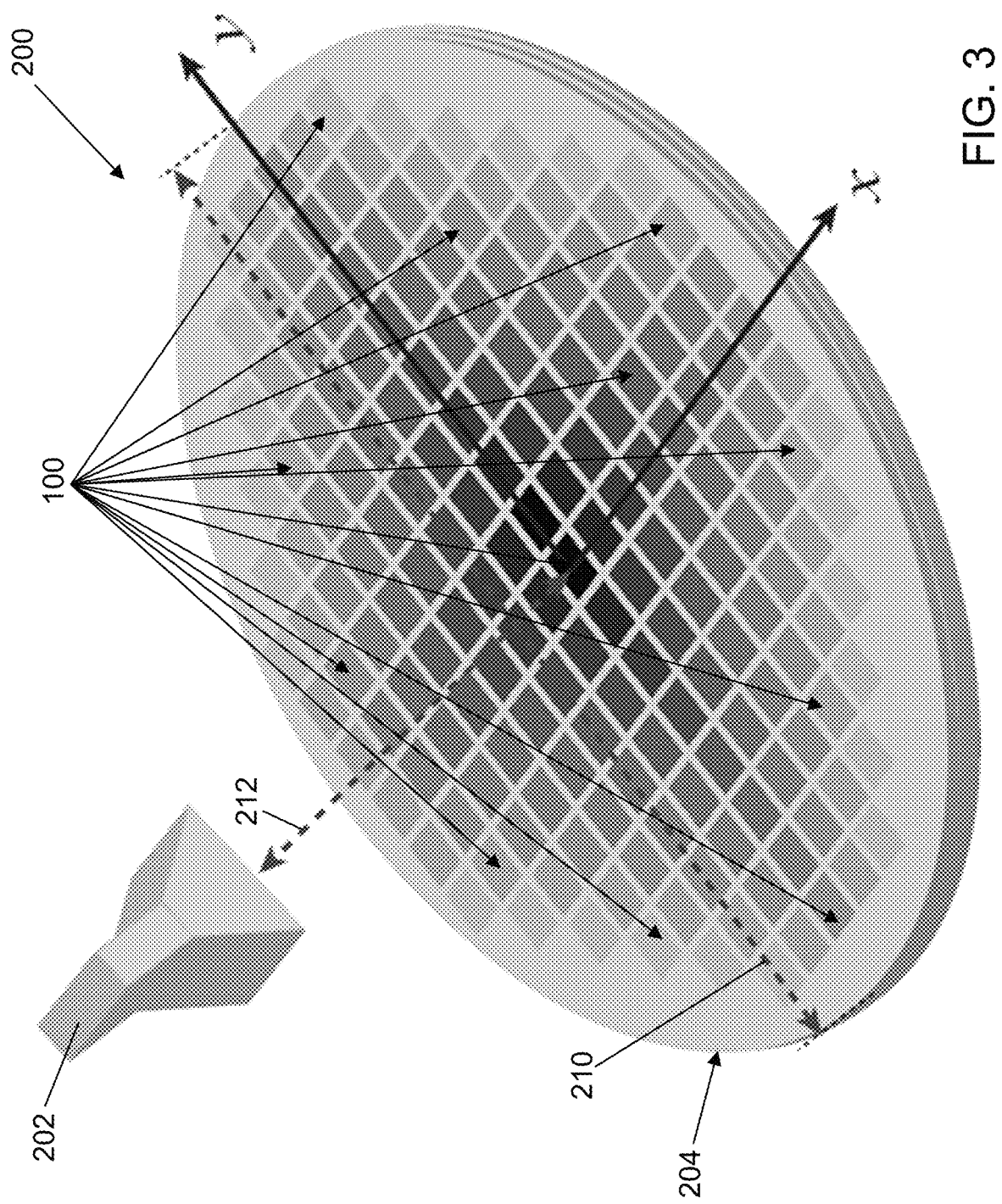
FIG. 3 depicts a perspective view of the transceiver system of FIG. 2 in accordance with an illustrative embodiment.

Referring to FIG. 2, a 1-D side view of a transceiver system 200 is shown in accordance with an illustrative embodiment. Referring to FIG. 3, a perspective view of transceiver system 200 is shown with a circular aperture in accordance with an illustrative embodiment. Transceiver system 200 may include a feed antenna 202 and a plurality of 2-bit phase shift elements. Transceiver system 200 may act as a transmitter or a receiver of analog or digital signals. The plurality of 2-bit phase shift elements is arranged to form a reflectarray antenna 204. Feed antenna 202 may have a low gain. Feed antenna 202 may be a dipole antenna, a monopole antenna, a helical antenna, a microstrip antenna, a patch antenna, a fractal antenna, a feed horn, a slot antenna, an end fire antenna, a parabolic antenna, etc. Feed antenna 202 is illustrated as a feed horn and is positioned at a center of reflectarray antenna 204. The plurality of 2-bit phase shift elements are arranged to form a circular 2-D array of 2-bit phase shift elements in the illustrative embodiment.

Feed antenna 202 is positioned a focal distance 212, $f_d$, from a front face 205 of the plurality of 2-bit phase shift elements. Feed antenna 202 is configured to receive an analog or a digital signal, and in response, to radiate a spherical radio wave 206 toward front face 205 of the plurality of 2-bit phase shift elements. For example, front face 205 may include antenna 102 of each 2-bit phase shift element 100. Feed antenna 202 also may be configured to receive spherical radio wave 206 from front face 205 of the plurality of 2-bit phase shift elements and to generate an analog or a digital signal in response.

The plurality of 2-bit phase shift elements may be arranged to form a one-dimensional (1D) or a two-dimensional (2D) array of spatial phase shift elements in any direction. The plurality of 2-bit phase shift elements may form variously shaped apertures including circular, rectangular, square, elliptical, etc. The plurality of 2-bit phase shift elements can include any number of 2-bit phase shift elements. The plurality of 2-bit phase shift elements define an aperture length 210. A center of each 2-bit phase shift element 100 may be separated a distance 214 from a center of its neighbors in any direction.

Spherical radio wave 206 reaches different portions of front face 205 at different times. The plurality of 2-bit phase shift elements can be considered to be a plurality of pixels each of which act as a 2-bit phase shift unit by providing a selected phase shift within the frequency band of interest. Thus, each 2-bit phase shift element of the plurality of 2-bit phase shift elements acts as a phase shift circuit selected such that spherical radio wave 206 is re-radiated in the form of a planar wave 208 that is parallel to front face 205, or vice versa. Given aperture length 210 and focal distance 212, the phase shift profile provided for the plurality of 2-bit phase shift elements to form planar wave 208 directed to a specific angle can be calculated as understood by a person of skill in the art.

For example, assuming feed antenna 202 is aligned to emit spherical radio wave 206 at the focal point of the plurality of 2-bit phase shift elements, the time it takes for each ray to arrive at front face 205 is determined by a length of each ray trace, i.e., the distance traveled by the electromagnetic wave traveling at the speed of light. A minimum time corresponds to a propagation time of the shortest ray trace, which is the line path from feed antenna 202 to a center of front face 205 for a center positioned feed antenna 202. A maximum time corresponds to a propagation time of the longest ray trace, which is the line path from feed antenna 202 to an edge of front face 205 for the center positioned feed antenna 202. Feed antenna 202 may be positioned at an off-center position with a resulting change in the distribution of ray traces to each 2-bit phase shift element. Of course, because the distance varies between feed antenna 202 and each 2-bit phase shift element of reflectarray antenna 204, a magnitude of the portion of spherical radio wave 206 received by each 2-bit phase shift element also varies. Illustrative distribution patterns and methods for defining distribution patterns for reflectarray antenna 204 are described in U.S. Patent Publication Number 2021/0280972.

Reflecting circuit 104 may include one or more switches arranged to define a first mode, a second mode, a third mode, and a fourth mode that define a distinct phase state of 2-bit phase shift element 100. Reflecting circuit 104 provides 2-bit phase quantization for 2-bit phase shift element 100 by exploiting four distinct reflection modes.

Figure 4:
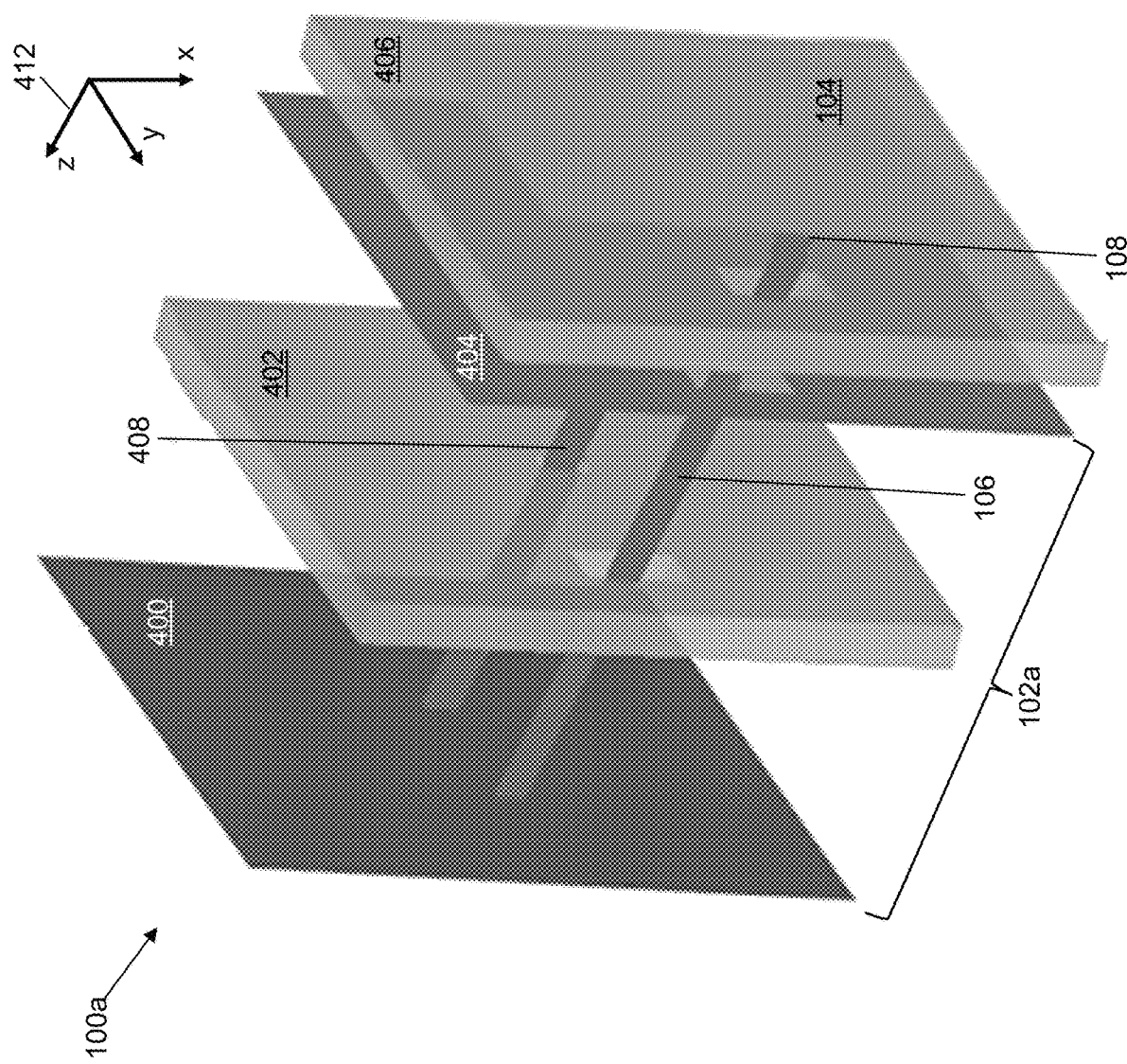
FIG. 4 depicts an exploded, perspective view of the 2-bit phase shift element of FIG. 1 with a patch antenna element in accordance with an illustrative embodiment.

Referring to FIG. 4, an exploded perspective view of a first 2-bit phase shift element 100a is shown in accordance with an illustrative embodiment. First 2-bit phase shift element 100a may include a first antenna 102a connected to reflecting circuit 104. First antenna 102a is implemented as a patch antenna that includes a conducting sheet 400, a first antenna dielectric layer 402, and a ground plane 404. Dimensions of first antenna 102a may be selected based on a frequency of operation selected for transceiver system 200. Reflecting circuit 104 is implemented on a reflector dielectric layer 406.

Conducting sheet 400 may have a planar rectangular, circular, triangular, or other polygonal or elliptical shape. Conducting sheet 400 may be formed of a sheet of conductive material such as copper plated steel, silver plated steel, silver plated copper, silver plated copper clad steel, copper, copper clad aluminum, steel, etc. Conducting sheet 400 is a conducting surface with high conductivity that reflects received electromagnetic waves. Conducting sheet 400 may be generally flat or formed of ridges or bumps. For illustration, conducting sheet 400 may be formed of a flexible membrane coated with a conductor.

First antenna dielectric layer 402 may have a planar rectangular, circular, triangular, or other polygonal or elliptical shape with dimensions that are similar to conducting sheet 400. First antenna dielectric layer 402 is formed of one or more dielectric materials that may include foamed polyethylene, solid polyethylene, polyethylene foam, polytetrafluoroethylene, air, air space polyethylene, vacuum, etc. Illustrative dielectric materials include a 5880 laminate sold by Rogers Corporation headquartered in Chandler, Arizona, USA.

Ground plane 404 may have a planar rectangular, circular, triangular, or other polygonal or elliptical shape with dimensions that are similar to conducting sheet 400. Ground plane 404 may be formed of a sheet of conductive material such as copper plated steel, silver plated steel, silver plated copper, silver plated copper clad steel, copper, copper clad aluminum, steel, etc. Ground plane 404 is a conducting surface that provides a fixed potential that may be, but is not necessarily, a ground potential. Ground plane 404 may be generally flat or formed of ridges or bumps. For illustration, ground plane 404 may be formed of a flexible membrane coated with a conductor.

Reflector dielectric layer 406 may have a planar rectangular, circular, triangular, or other polygonal or elliptical shape with dimensions that are similar to conducting sheet 400. Reflector dielectric layer 406 is formed of one or more dielectric materials that may include foamed polyethylene, solid polyethylene, polyethylene foam, polytetrafluoroethylene, air, air space polyethylene, vacuum, etc. Illustrative dielectric materials include a 5880 laminate sold by Rogers Corporation headquartered in Chandler, Arizona, USA.

First dielectric layer 402 and reflector dielectric layer 406 may be formed of the same or different dielectric materials and the same or a different number of layers of dielectric material. Conducting sheet 400 and ground plane 404 may be formed of the same or different conductive materials.

Conducting sheet 400 is mounted between first dielectric layer 202 and ground plane 404 such that a top surface of first dielectric layer 102 is mounted to a bottom surface of conducting sheet 400, and a bottom surface of first dielectric layer 102 is mounted to a top surface of ground plane 404. A top surface of reflector dielectric layer 406 is mounted to a bottom surface of ground plane 404. Reflecting circuit 104 is mounted on a bottom surface of reflector dielectric layer 406 opposite ground plane 404.

In the illustrative embodiment, each of conducting sheet 400, first dielectric layer 402, ground plane 404, and reflector dielectric layer 406 has a generally square top and bottom surface shape in an x-y plane and a thickness in a vertical direction denoted by a z-axis, where an x-axis is perpendicular to a y-axis, and both the x-axis and the y-axis are perpendicular to the z-axis to form a right-handed coordinate 3-dimensional (D) reference frame denoted x-y-z frame 412. The top and bottom surfaces of conducting sheet 400, first dielectric layer 402, ground plane 404, and reflector dielectric layer 406 are defined in the x-y plane of x-y-z frame 412.

Conducting sheet 400 may be connected to ground plane 404 through an interconnect line 408 that is connected at approximately a center of conducting sheet 400. Interconnect line 408 may be a wire, a trace, a vertical interconnect access, or any other means of direct electrical connection. Conducting sheet 400 may be connected to I/O port 108 of reflecting circuit 104 using antenna-reflector line 106 that extends through first antenna dielectric layer 402, ground plane 404 and reflector dielectric layer 406. Antenna-reflector line 106 may be surrounded by a dielectric material where antenna-reflector line 106 extends through ground plane 404. Interconnect line 408 and antenna-reflector line 106 may be formed of a conductive material that is the same as or different from the conductive material of conducting sheet 400 and ground plane 404.

In the illustrative embodiment, interconnect line 408 and antenna-reflector line 106 are generally parallel to each other. In the illustrative embodiment, interconnect line 408 extends in a generally perpendicular direction through the top and bottom surfaces of first dielectric layer 402. In the illustrative embodiment, antenna-reflector line 106 extends in a generally perpendicular direction through the top and bottom surfaces of first dielectric layer 402, ground plane 404, and reflector dielectric layer 406.

Interconnect line 408 and antenna-reflector line 106 may be formed of a conductive material such as copper plated steel, silver plated steel, silver plated copper, silver plated copper clad steel, copper, copper clad aluminum, steel, etc. Interconnect line 408 and antenna-reflector line 106 may be generally flat or formed of ridges or bumps. For illustration, interconnect line 408 and antenna-reflector line 106 may be formed of a flexible membrane coated with a conductor. Interconnect line 408 and antenna-reflector line 106 may be formed of the same or different conductive materials. Interconnect line 408 and antenna-reflector line 106 may be formed of the same or different conductive material that that used to form second pentagon segment 514.

Interconnect line 408 and antenna-reflector line 106 may be a wire, a trace, a vertical interconnect access, or any other means of direct electrical connection. Antenna-reflector line 106 may be surrounded by a dielectric material where antenna-reflector line 106 extends through ground plane 404.

Figure 5:
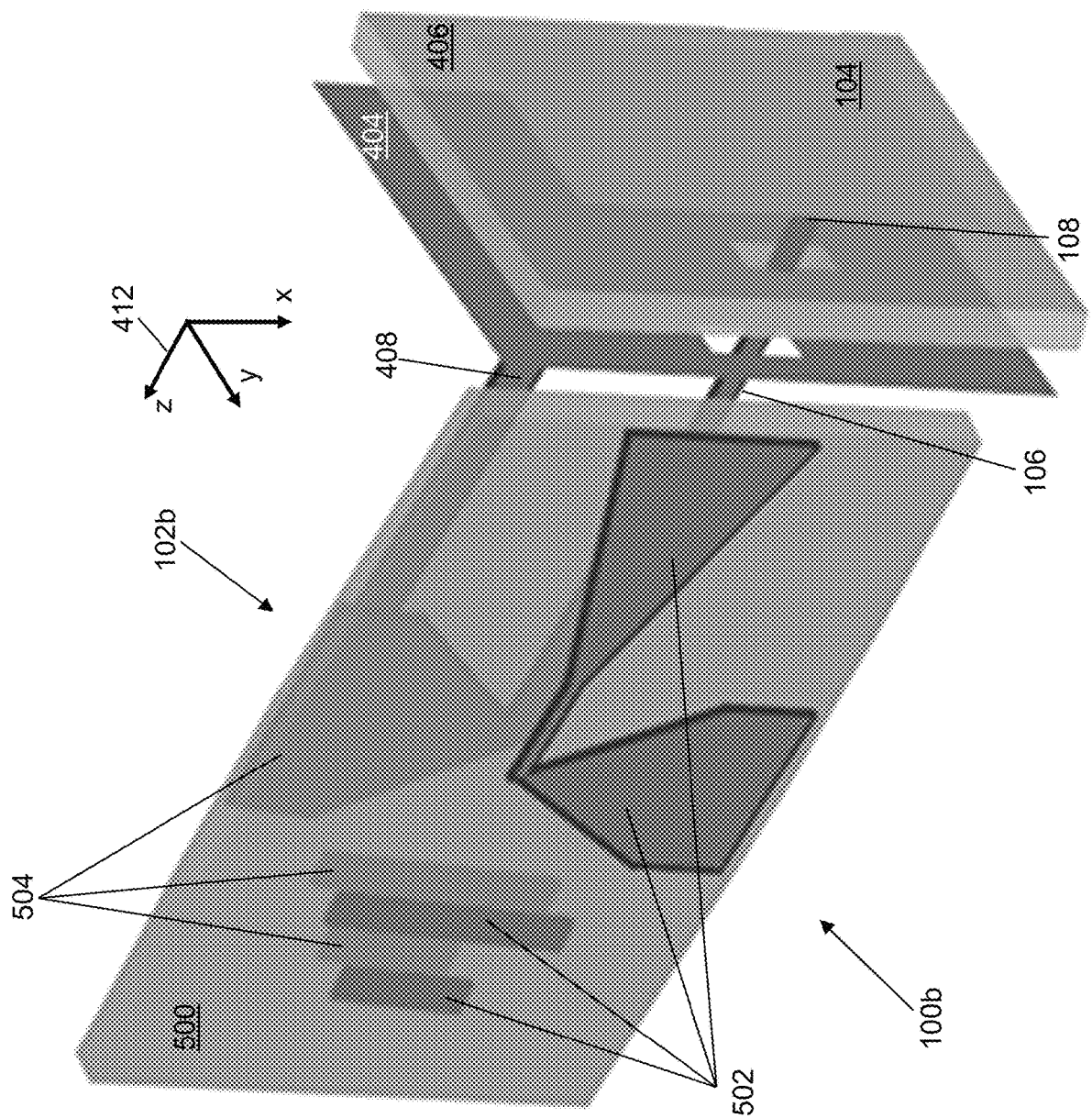
FIG. 5 depicts an exploded, perspective view of the 2-bit phase shift element of FIG. 1 with a dipole antenna element in accordance with an illustrative embodiment.

Referring to FIG. 5, an exploded perspective view of a second 2-bit phase shift element 100b is shown in accordance with an illustrative embodiment. Second 2-bit phase shift element 100b may include a second antenna 102b connected to reflecting circuit 104. Second antenna 102b is implemented as a dipole antenna that includes a second antenna dielectric layer 500, a first conducting pattern layer 502, and a second conducting pattern layer 504. Dimensions of second antenna 102b may be selected based on a frequency of operation selected for transceiver system 200.

Second conducting pattern layer 504 is shown in shadow through second antenna dielectric layer 500 so that it can be shown in FIG. 5. First conducting pattern layer 502 is formed on a first face of second antenna dielectric layer 500, and second conducting pattern layer 504 is formed on a second face of second antenna dielectric layer 500 that faces outward in an opposite direction relative to the first face of second antenna dielectric layer 500. The first face and the second face of second antenna dielectric layer 500 are parallel to the x-z-plane of the x-y-z frame 412.

In the illustrative embodiment, first conducting pattern layer 502 may include a first short bar segment, a first long bar segment, a first pentagon segment, and a triangle segment. The first long bar segment has a longer length in a length direction than the first short bar segment with a similar width in a width direction. The length direction is parallel to the x-axis of the x-y-z frame 412, and the width direction is parallel to the x-axis of the x-y-z frame 412. The first long bar segment and the first short bar segment extend parallel to each other in the length direction and do not contact each other. The first long bar segment is mounted closer to the first pentagon segment than the first short bar segment. The first pentagon has a shape described by a convex pentagon with adjacent right angles. The triangle segment has a shape described by a channel from which an isosceles triangle extends. The triangle segment is connected to the first pentagon segment along an edge of the channel opposite an edge from which the isosceles triangle extends and at a peak of the first pentagon segment. The channel of the triangle segment extends in a direction that is generally perpendicular to the length direction of the first short bar segment and the first long bar segment. The channel of the triangle segment extends away from the first short bar segment and the first long bar segment. A base of the isosceles triangle of the triangle segment is mounted near an edge of second antenna dielectric layer 500 that is parallel to the x-axis of the x-y-z frame 412. A base of the first pentagon segment that extends between the adjacent right angles is mounted near an edge of second antenna dielectric layer 500 that is parallel to the z-axis of the x-y-z frame 412.

In the illustrative embodiment, second conducting pattern layer 502 may include a second short bar segment, a second long bar segment, and a second pentagon segment. The first short bar segment is a mirror image of the second short bar segment through second antenna dielectric layer 500. The first long bar segment is a mirror image of the second long bar segment through second antenna dielectric layer 500. The second long bar segment is mounted closer to the second pentagon segment than the second short bar segment. The second pentagon is a mirror image of the first pentagon through second antenna dielectric layer 500 except that the second pentagon is rotated 180° relative to the peak of the first pentagon.

In the illustrative embodiment, interconnect line 408 is connected between the second pentagon segment and ground plane 404. Interconnect line 408 extends from an edge of the second pentagon segment that includes one of the adjacent right angles. In alternative embodiments, interconnect line 408 may be connected between the first pentagon segment and ground plane 404 or may not be included. Additionally, depending on a bias scheme a capacitor may be used between interconnect line 408 and ground plane 404.

Antenna-reflector line 106 is connected between the peak of the second pentagon segment and I/O port 108 of reflecting circuit 104. Interconnect line 408 and antenna-reflector line 106 extend generally parallel to each other. Antenna-reflector line 106 extends through ground plane 404 and reflector dielectric 406.

In the illustrative embodiment of FIG. 5, second antenna dielectric layer 500 is generally perpendicular to ground plane 404 and reflector dielectric 406. In the illustrative embodiment, interconnect line 408 and antenna-reflector line 106 are generally parallel to each other. In the illustrative embodiment of FIG. 5, antenna-reflector line 106 extends parallel to the second face of second antenna dielectric layer 500 through the top and bottom surfaces of ground plane 404 and reflector dielectric layer 406.

Figure 12:
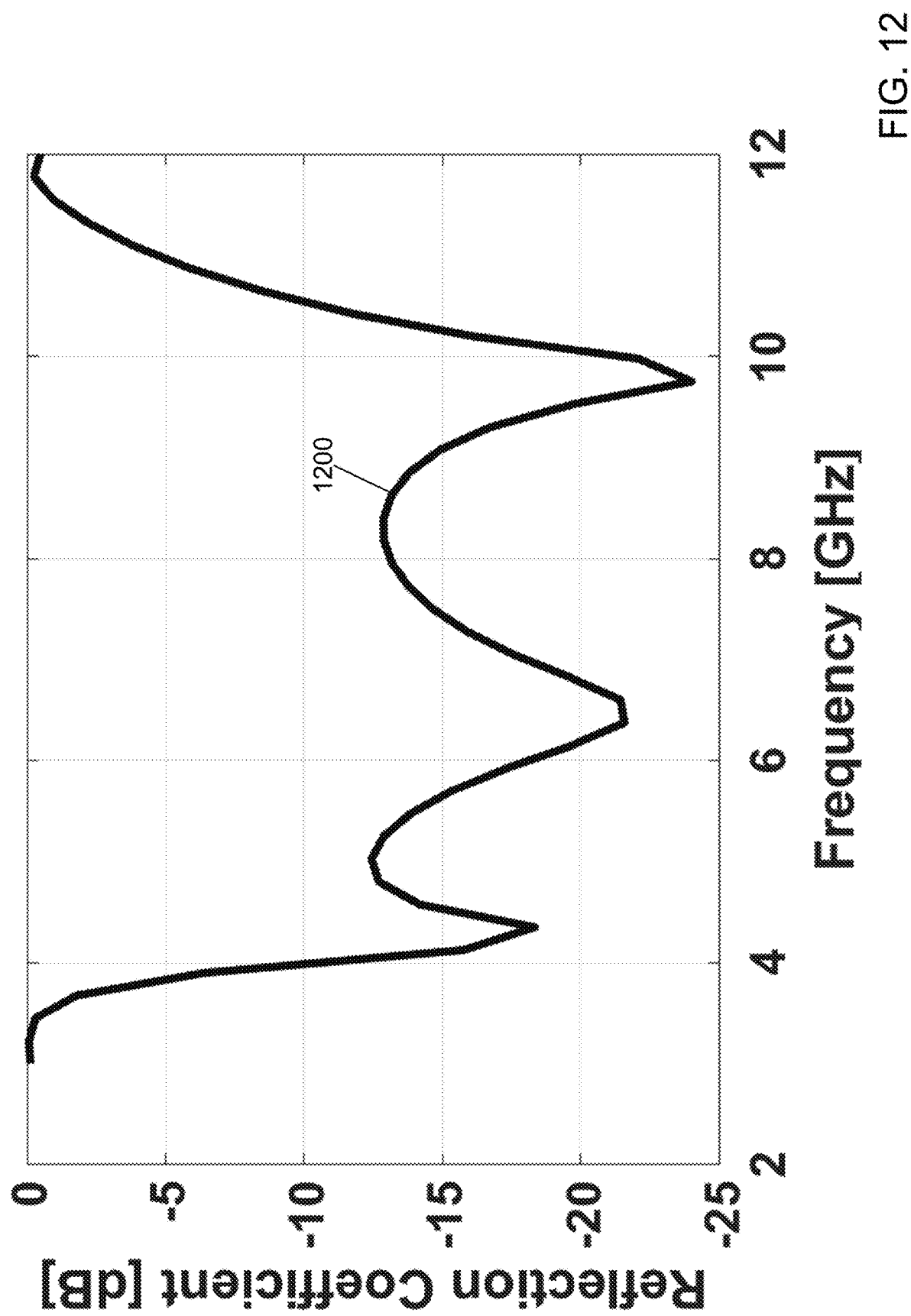
FIG. 12 shows a reflection coefficient as a function of frequency of the dipole antenna of FIG. 5 alone in accordance with an illustrative embodiment.

In the illustrative embodiment, second antenna 102b is a dipole antenna with an unbalanced geometry to provide a wideband response and simple design design procedure. Second antenna 102b may receive a signal from an incident wave with an electric field polarization parallel to the x-axis of the x-y-z frame 412 and transfer the received signal transfer to reflecting circuit 104 on antenna-reflector line 106. For a wideband response, second antenna 102b provides impedance values with only real values over a wide bandwidth by being matched to a design's characteristic impedance. An illustrative second antenna 102b was designed on Rogers 5880 with a permittivity of 2.2, a loss tangent of 0.0009, and a thickness of 31 millimeters and was optimized to be matched to 50 Ohm over a wide bandwidth. Referring to FIG. 12, a curve 1200 shows a simulated reflection coefficient of second antenna 102b in accordance with the illustrative embodiment. A reflection coefficient better than −12.5 dB was achieved over a bandwidth from 4-10.5 gigahertz (GHz).

Figure 6:
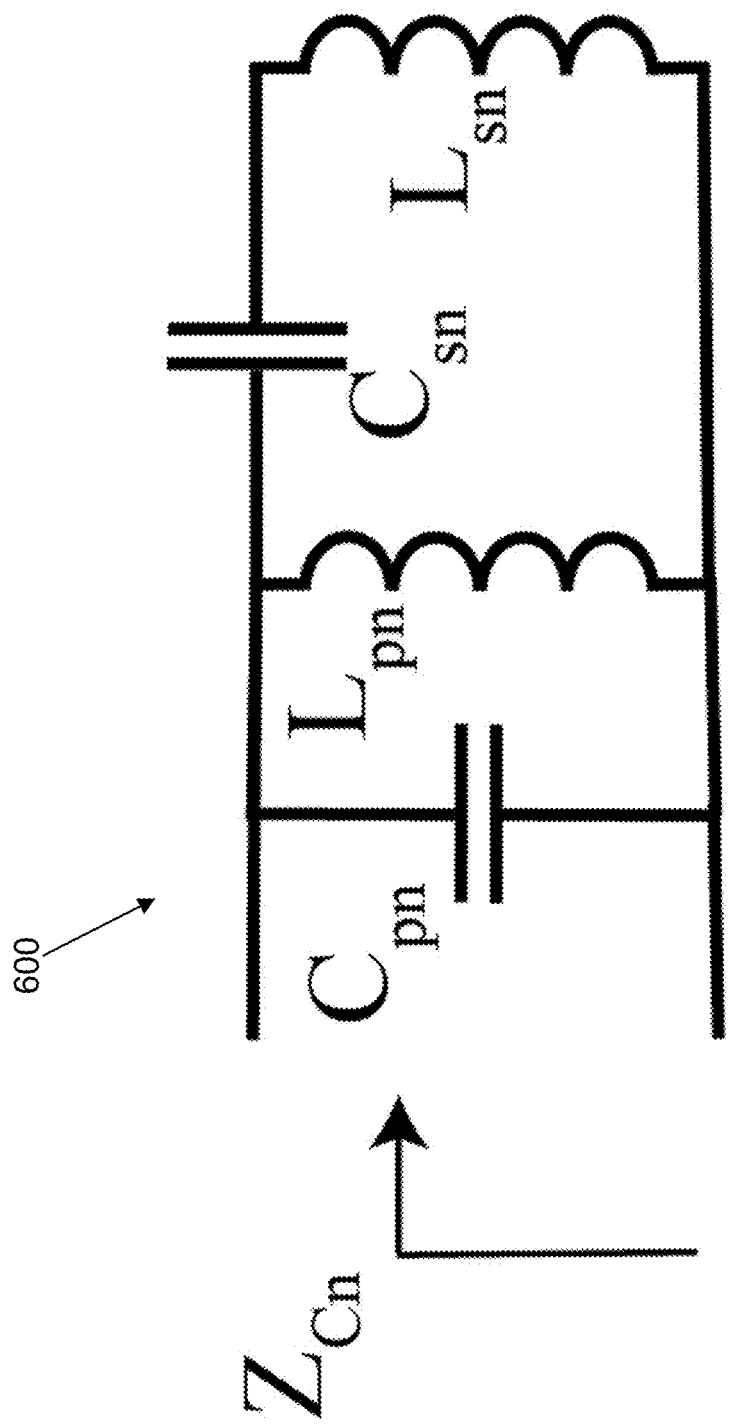
FIG. 6 depicts a circuit diagram of an equivalent circuit for a 2-bit reflecting circuit of the 2-bit phase shift element of FIG. 1 in accordance with an illustrative embodiment.

Referring to FIG. 6, an equivalent circuit 600 for reflecting circuit 104 is shown in accordance with an illustrative embodiment. A reflecting circuit impedance $Z_{C_n}$, n=1, ..., 4 may be defined using equivalent circuit 600 for an $n^{th}$ mode or phase state based on an $n^{th}$ parallel capacitance value $C_{pn}$, an $n^{th}$ parallel inductance value $L_{pn}$, an $n^{th}$ series capacitance value $C_{sn}$, and an $n^{th}$ series inductance value $L_{sn}$. Depending on a circuitry implementation of each phase state using reflecting circuit 104, equivalent circuit 600 may not include one or more of the $n^{th}$ parallel capacitance value $C_{pn}$, the $n^{th}$ parallel inductance value $L_{pn}$, the $n^{th}$ series capacitance value $C_{sn}$, and the $n^{th}$ series inductance value $L_{sn}$.

Discrete circuit elements, micro-electromechanical systems (MEMS) components, and transmission lines may be used to provide each reflecting circuit impedance $Z_{C_n}$ of reflecting circuit 104. The four different phase shifts of 0°, 90°, 180°, and 270° can be generated in the reflected signal by controlling a state of switches of reflecting circuit 104 that thereby change the reflecting circuit impedance $Z_{C_n}$ of reflecting circuit 104. For example, the state of the switches can be controlled by turning them on or off. Each switch may be a single pole, single throw (SPST) switch or other electrical structure such as a positive-intrinsic-negative (PIN) diode that behaves like a SPST switch. In an alternative embodiment, a single pole four throw (SP4T) switch may be used to switch between the four phase states.

Figure 7A:
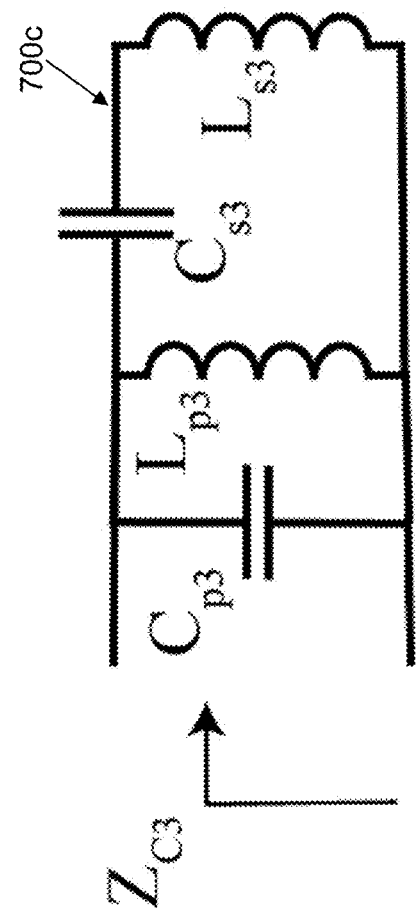
FIGS. 7A through 7D depict a first set of circuit diagrams for four phase states based on the equivalent circuit of FIG. 6 in accordance with an illustrative embodiment.
Figure 7B:
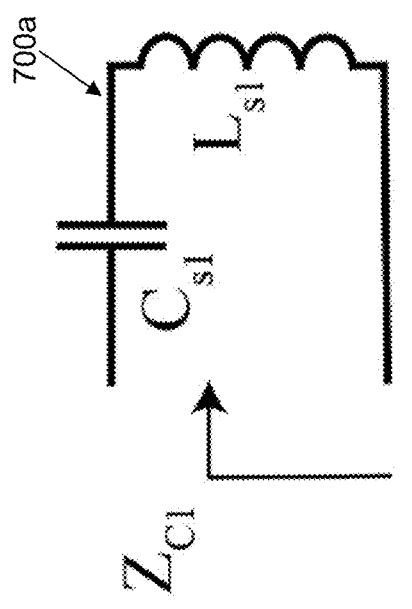
Figure 7C:
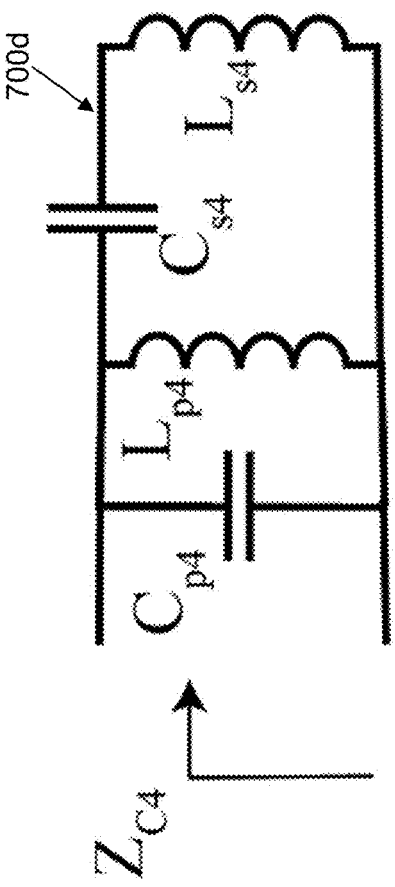
Figure 7D:
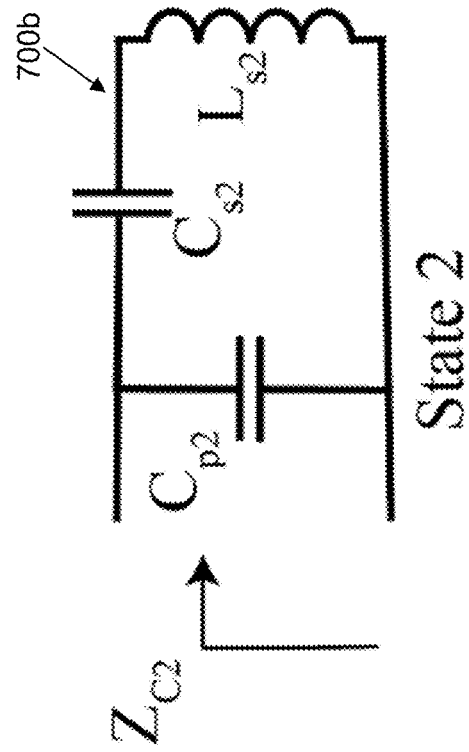

For illustration, referring to FIG. 7A, a first equivalent circuit 700a for a first phase state is shown in accordance with an illustrative embodiment that results in a 0° phase shift in the reflected signal. Referring to FIG. 7B, a second equivalent circuit 700b for a second phase state is shown in accordance with an illustrative embodiment that results in a −90° phase shift in the reflected signal. Referring to FIG. 7C, a third equivalent circuit 700c for a third phase state is shown in accordance with an illustrative embodiment that results in a 180° phase shift in the reflected signal. Referring to FIG. 7D, a fourth equivalent circuit 700d for a fourth phase state is shown in accordance with an illustrative embodiment that results in a 90° phase shift in the reflected signal.

Figure 8:
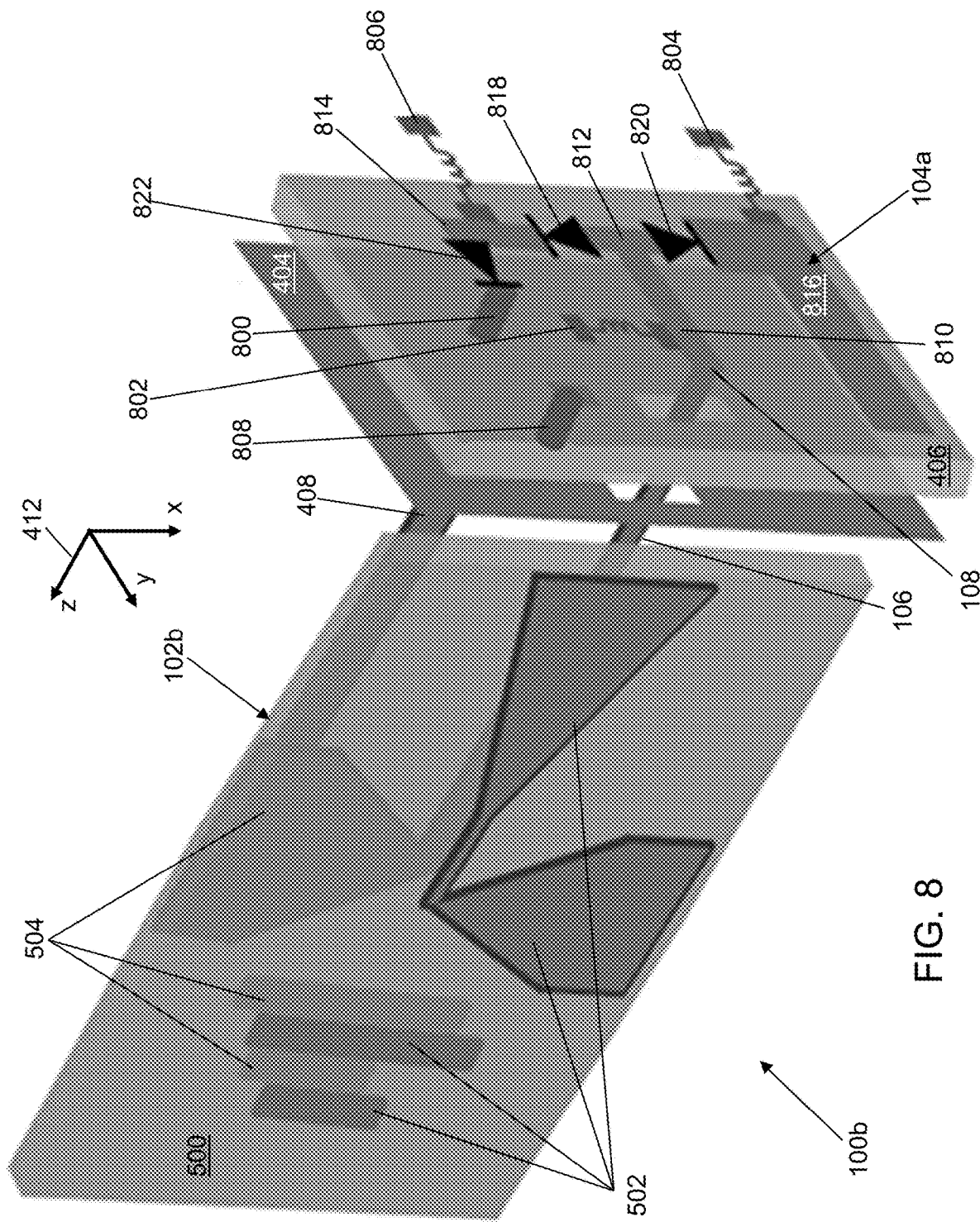
FIG. 8 depicts the exploded, perspective view of the 2-bit phase shift element of FIG. 5 with a first 2-bit reflecting circuit controllable to generate the four phase states of FIGS. 7A through 7D in accordance with an illustrative embodiment.
Figure 9A:
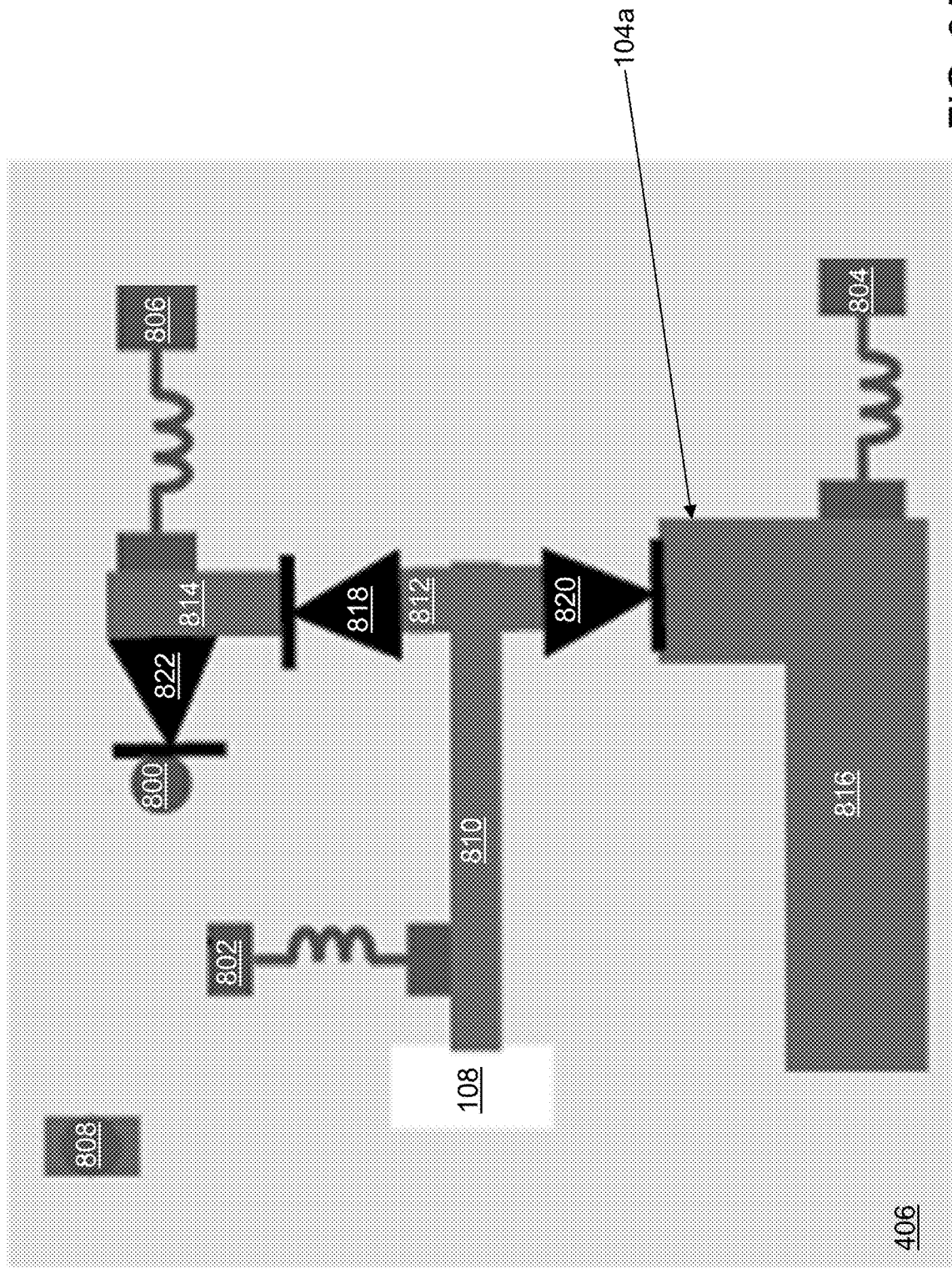
FIG. 9A depicts the first 2-bit reflecting circuit of FIG. 8 on a dielectric layer in accordance with an illustrative embodiment.

Referring to FIG. 8, an exploded perspective view of second 2-bit phase shift element 100b is shown in accordance with an illustrative embodiment including a first reflecting circuit 104a. Referring to FIG. 9A, a bottom view of reflector dielectric layer 406 to which first reflecting circuit 104a is mounted is shown in accordance with an illustrative embodiment. First reflecting circuit 104a provides the four equivalent circuit states described by FIGS. 7A-7D. First reflecting circuit 104a may include a via 800, a first voltage pad 802, a second voltage pad 804, a third voltage pad 806, a fourth voltage pad 808, a first line 810, a second line 812, a third line 814, a fourth line 816, a first diode 818, a second diode 820, and a third diode 822. Via 800 is connected to fourth voltage pad 808. Voltages applied to first voltage pad 802, second voltage pad 804, third voltage pad 806, and fourth voltage pad 808 can be controlled to define an on-state (current conducting state) or an off-state (non-current conducting state) of first diode 818, second diode 820, and third diode 822. Via 800, first line 810, second line 812, third line 814, and fourth line 816 are sections of transmission line that connect to first diode 818, second diode 820, and/or third diode 822 and are shaped and sized to provide a specific impedance when current flows on a respective line based on a state of each of first diode 818, second diode 820, and third diode 822. Through use of first diode 818, second diode 820, and third diode 822, via 800, first line 810, second line 812, third line 814, and fourth line 816 provide a tunable impedance for the reflection load by controlling a flow of current on each line. In an alternative embodiment, fourth voltage pad 808 may be connected directly to third diode 822 instead of through via 800. First voltage pad 802, second voltage pad 804, third voltage pad 806, and fourth voltage pad 808 may connect to a line through a bias inductance.

The signal received by antenna 102 is provided to first reflecting circuit 104a at I/O port 108 that is connected to a first end of first line 810. Second line 812 is connected to extend in a generally perpendicular direction relative to a second end of first line 810 opposite the first end of first line 810. First diode 818 is connected to a first end of second line 812. Second diode 820 is connected to a second end of second line 812 opposite the first end of second line 812. First diode 818 is also connected to a first end of third line 814. Third diode 822 is connected to a first side of third line 814 adjacent a second end of third line 814 opposite the first end of third line 814. Second diode 820 is also connected to a first end of fourth line 816.

In the illustrative embodiment, first diode 818 is oriented to conduct current in the on-state from second line 812 to third line 814. Second diode 820 is oriented to conduct current in the on-state from second line 812 to fourth line 816. Third diode 822 is oriented to conduct current in the on-state from third line 814 to via 800.

First voltage pad 802 is connected to first line 810 and may provide a reference voltage. Second voltage pad 804 is connected to a corner of fourth line 816. Third voltage pad 806 is connected to a second side of third line 814 adjacent the second end of third line 814. The second side of third line 814 is opposite the first side of third line 814. Fourth voltage pad 808 is connected to via 800 and mounted near an upper left corner of reflector dielectric layer 406.

First line 810, second line 812, and third line 814 are straight sections of transmission line. Second line 812 and third line 814 are oriented perpendicular to first line 810. Fourth line 816 is an L-shaped section of transmission line, where a first section is parallel to first line 810 and a second section is parallel to second line 812 and third line 814. The dimensions of via 800, first line 810, second line 812, third line 814, and fourth line 816 are selected to define a specific impedance value based on the frequency of operation of transceiver system 200. A transmission line has well-defined characteristics and is not simply a conductive wire, the length of which can be ignored by assuming the same alternating current voltage along the entire conductive wire at a given time. As understood by a person of skill in the art, a transmission line can be modeled as an inductor-capacitor (LC) ladder network based on its physical dimensions and shape relative to a frequency of operation of transceiver system 200.

Table 1 below shows a switch state for each phase state provided by first reflecting circuit 104a.

TABLE 1

| Phase state | First diode 818 | Second diode 820 | Third diode 822 | Phase shift |
|---|---|---|---|---|
| 1 | Off | Off | Off | 0° |
| 2 | On | Off | Off | −90° |
| 3 | Off | On | Off | 180° |
| 4 | On | Off | On | 90° |

In the first phase state that achieves a phase shift of 0°, the signal enters at I/O port 108 and propagates along first line 810 and second line 812 until the signal reaches first diode 818 and second diode 820 that are in the off-state such that the current flow is reflected. First reflecting circuit 104a provides an open circuit when the signal reaches first diode 818 and second diode 820 and reflects substantially all of the signal back towards I/O port 108. The reflection phase may be determined by approximately twice a length of first line 810 and second line 812.

In the second phase state that achieves a phase shift of −90°, the signal enters at I/O port 108 and propagates along first line 810, a top portion of second line 812, and third line 814 until the signal reaches third diode 822 that is in the off-state such that the current flow is reflected. First reflecting circuit 104a provides an open circuit when the signal reaches third diode 822 and reflects substantially all of the signal back towards I/O port 108. The reflection phase may be determined by approximately twice a length of first line 810, the top portion of second line 812, and third line 814.

In the third phase state that achieves a phase shift of 180°, the signal enters at I/O port 108 and propagates along first line 810, a bottom portion of second line 812, and fourth line 816 until the signal reaches an end of fourth line 816 such that the current flow is reflected. First reflecting circuit 104a provides an open circuit when the signal reaches the end of fourth line 816 and reflects substantially all of the signal back towards I/O port 108. The reflection phase may be determined by approximately twice a length of first line 810, the bottom portion of second line 812, and fourth line 816.

In the fourth phase state that achieves a phase shift of 90°, the signal enters at I/O port 108 and propagates along first line 810, a top portion of second line 812, and third line 814 until the signal reaches via 800 that is short circuited to ground plane 404 such that the current flow is reflected. First reflecting circuit 104a provides a short circuit when the signal reaches via 800 and reflects substantially all of the signal back towards I/O port 108. The reflection phase may be determined by approximately twice a length of first line 810, the top portion of second line 812, and third line 814 and the 180° phase shift that results when the signal reaches via 800.

The first phase state of 2-bit phase shift element 100 may be designated as a "bit 00" configuration also referred to as a first mode. The second phase state of 2-bit phase shift element 100 may be designated as a "bit 11" configuration also referred to as a second mode. The third phase state of 2-bit phase shift element 100 may be designated as a "bit 10" configuration also referred to as a third mode. The fourth phase state of 2-bit phase shift element 100 may be designated as a "bit 01" configuration also referred to as a fourth mode.

To simplify a DC biasing circuit, first diode 818, second diode 820, and third diode 822 can be controlled using two voltage states such as 0 volts (V) and 1 V, 2 V and 1 V, −1 V and 0 V, etc. though the conductive orientation of first diode 818, second diode 820, and/or third diode 822 may need to be changed. For example, if first reflecting circuit 104a is designed to use the two voltage states 0 V and 1 V, the orientation of first diode 818 and of second diode 820 is changed to conduct in the opposite direction. Thus, first diode 818 is oriented to conduct current in the on-state from third line 814 to second line 812, and second diode 820 is oriented to conduct current in the on-state from fourth line 816 to second line 812. Table 2 below shows a voltage applied to each voltage pad for each phase state provided by first reflecting circuit 104a designed to use the two voltage states 0 V and 1 V.

TABLE 2

| Phase state | First voltage pad 802 | Second voltage pad 804 | Third voltage pad 806 | Fourth voltage pad 808 |
|---|---|---|---|---|
| 1 | 0 | 0 | 0 | 0 |
| 2 | 0 | 0 | 1 | 1 |
| 3 | 0 | 1 | 0 | 0 |
| 4 | 0 | 0 | 1 | 0 |

Figure 9B:
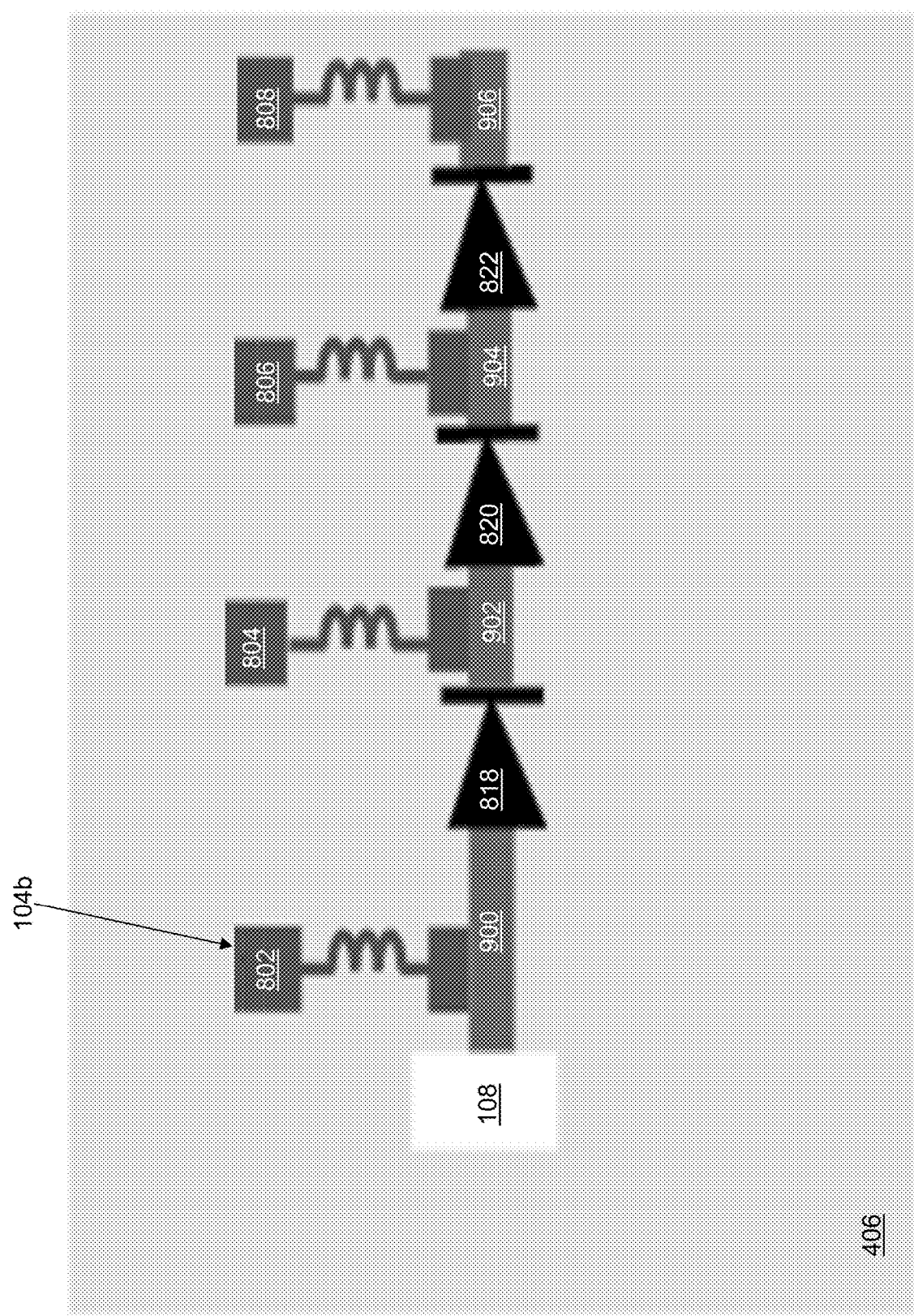
FIG. 9B depicts a second 2-bit reflecting circuit on the dielectric layer that is controllable to generate the four phase states of FIGS. 7A through 7D in accordance with an illustrative embodiment.

Referring to FIG. 9B, a bottom view of reflector dielectric layer 406 to which a second reflecting circuit 104b is mounted is shown in accordance with an illustrative embodiment. Second reflecting circuit 104b provides the four equivalent circuit states described by FIGS. 7A-7D. Second 2-bit phase shift element 100b may be modified to replace first reflecting circuit 104a with second reflecting circuit 104b. Second reflecting circuit 104b may include first voltage pad 802, second voltage pad 804, third voltage pad 806, fourth voltage pad 808, a first line 900, a second line 902, a third line 904, a fourth line 906, first diode 818, second diode 820, and third diode 822. Again, voltages applied to first voltage pad 802, second voltage pad 804, third voltage pad 806, and fourth voltage pad 808 can be controlled to define an on-state (current conducting state) or an off-state (non-current conducting state) of first diode 818, second diode 820, and third diode 822. First line 900, second line 902, third line 904, and fourth line 906 are straight sections of transmission line that connect to first diode 818, second diode 820, and third diode 822 and are sized to provide a specific impedance when current flows on a respective line based on a state of each of first diode 818, second diode 820, and third diode 822. Through use of first diode 818, second diode 820, and third diode 822, first line 900, second line 902, third line 904, and fourth line 906 provide a tunable impedance for the reflection load by controlling a flow of current on each line.

The signal received by antenna 102 is provided to second reflecting circuit 104b at I/O port 108 that is connected to a first end of first line 900. First diode 818 is connected to a second end of first line 900 opposite the first end of first line 900. Second line 902 is connected between first diode 818 and second diode 820. Third line 904 is connected between second diode 820 and third diode 822. Fourth line 906 is connected to third diode 822.

First diode 818 is oriented to conduct current in the on-state from first line 900 to second line 902. Second diode 820 is oriented to conduct current in the on-state from second line 902 to third line 904. Third diode 822 is oriented to conduct current in the on-state from third line 904 to fourth line 906.

First voltage pad 802 is connected to first line 900. Second voltage pad 804 is connected to second line 902 and may provide a reference voltage. Third voltage pad 806 is connected to third line 904. Fourth voltage pad 808 is connected to fourth line 906.

Table 3 below shows a switch state for each phase state provided by second reflecting circuit 104b.

TABLE 3

| Phase state | First diode 818 | Second diode 820 | Third diode 822 | Phase shift |
|---|---|---|---|---|
| 1 | Off | Off | Off | 0° |
| 2 | On | Off | Off | −90° |
| 3 | On | On | Off | 180° |
| 4 | On | On | On | 90° |

In the first phase state that achieves a phase shift of 0°, the signal enters at I/O port 108 and propagates along first line 900 until the signal reaches first diode 818 that is in the off-state such that the current flow is reflected. Second reflecting circuit 104b provides an open circuit when the signal reaches first diode 818 and reflects substantially all of the signal back towards I/O port 108. The reflection phase may be determined by approximately twice a length of first line 900.

In the second phase state that achieves a phase shift of −90°, the signal enters at I/O port 108 and propagates along first line 900 and second line 902 until the signal reaches second diode 820 that is in the off-state such that the current flow is reflected. Second reflecting circuit 104b provides an open circuit when the signal reaches second diode 820 and reflects substantially all of the signal back towards I/O port 108. The reflection phase may be determined by approximately twice a length of first line 900 and second line 902.

In the third phase state that achieves a phase shift of 180°, the signal enters at I/O port 108 and propagates along first line 900, second line 902, and third line 904 until the signal reaches third diode 822 that is in the off-state such that the current flow is reflected. Second reflecting circuit 104b provides an open circuit when the signal reaches third diode 822 and reflects substantially all of the signal back towards I/O port 108. The reflection phase may be determined by approximately twice a length of first line 900, second line 902, and third line 904.

In the fourth phase state that achieves a phase shift of 90°, the signal enters at I/O port 108 and propagates along first line 900, second line 902, third line 904, and fourth line 906 until the signal reaches the end of fourth line 906 and reflects substantially all of the signal back towards I/O port 108.

Second reflecting circuit 104b provides an open circuit when the signal reaches the end of fourth line 906 and reflects substantially all of the signal back towards I/O port 108. The reflection phase may be determined by approximately twice a length of first line 900, second line 902, third line 904, and fourth line 906.

If second reflecting circuit 104b is designed to use the two voltage states 0 V and 1 V, the orientation of second diode 820 is changed to conduct in the opposite direction. Thus, second diode 820 is oriented to conduct current in the on-state from third line 904 to second line 902. Table 4 below shows a voltage applied to each voltage pad for each phase state provided by second reflecting circuit 104b designed to use the two voltage states 0 V and 1 V.

TABLE 4

| Phase state | First voltage pad 802 | Second voltage pad 804 | Third voltage pad 806 | Fourth voltage pad 808 |
|---|---|---|---|---|
| 1 | 0 | 0 | 0 | 0 |
| 2 | 1 | 0 | 0 | 0 |
| 3 | 1 | 0 | 1 | 1 |
| 4 | 1 | 0 | 1 | 0 |

Figure 9C:
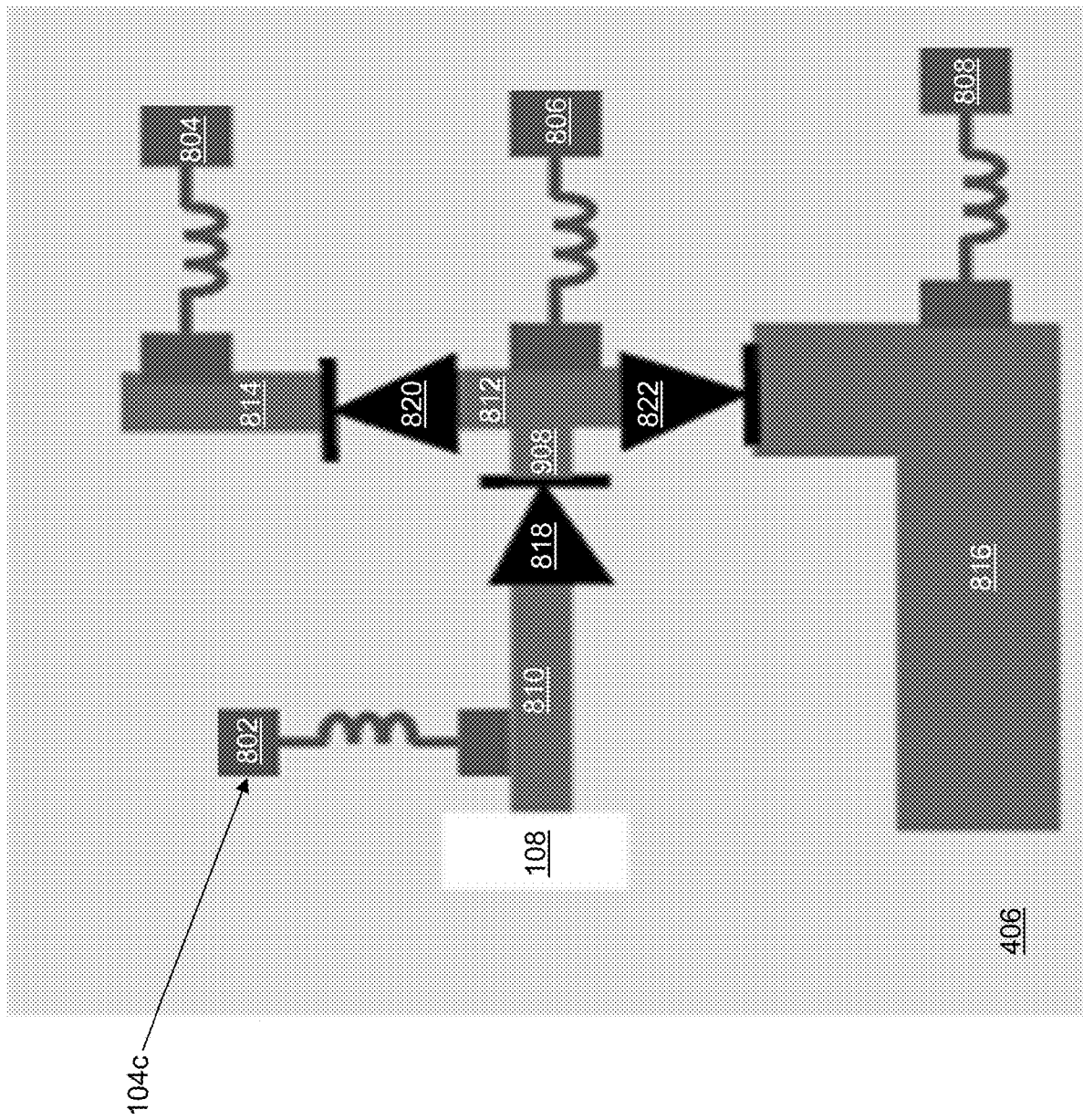
FIG. 9C depicts a third 2-bit reflecting circuit on the dielectric layer that is controllable to generate the four phase states of FIGS. 7A through 7D in accordance with an illustrative embodiment.

Referring to FIG. 9C, a bottom view of reflector dielectric layer 406 to which a third reflecting circuit 104c is mounted is shown in accordance with an illustrative embodiment. Third reflecting circuit 104c provides the four equivalent circuit states described by FIGS. 7A-7D. Second 2-bit phase shift element 100b may be modified to replace first reflecting circuit 104a with third reflecting circuit 104c. Third reflecting circuit 104c may include first voltage pad 802, second voltage pad 804, third voltage pad 806, fourth voltage pad 808, first line 810, a fifth line 908, second line 812, third line 814, fourth line 816, first diode 818, second diode 820, and third diode 822. Again, voltages applied to first voltage pad 802, second voltage pad 804, third voltage pad 806, and fourth voltage pad 808 can be controlled to define an on-state (current conducting state) or an off-state (non-current conducting state) of first diode 818, second diode 820, and third diode 822. First line 810, fifth line 908, second line 812, third line 814, and fourth line 816 are sections of transmission line that connect to first diode 818, second diode 820, and third diode 822 and are shaped and sized to provide a specific impedance when current flows on a respective line based on a state of each of first diode 818, second diode 820, and third diode 822. Through use of first diode 818, second diode 820, and third diode 822, first line 810, fifth line 908, second line 812, third line 814, and fourth line 816 provide a tunable impedance for the reflection load by controlling a flow of current on each line.

The signal received by antenna 102 is provided to third reflecting circuit 104c at I/O port 108 that is connected to a first end of first line 810. First diode 818 is connected between a second end of first line 810 opposite the first end of first line 810 and a first end of fifth line 908. A second end of fifth line 908 is connected to second line 812 approximately midway between second diode 820 and third diode 822. Second line 812 is connected to extend in a generally perpendicular direction relative to the second end of fifth line 908. Second diode 820 is connected between a first end of second line 812 and the first end of third line 814. Third diode 822 is connected between a second end of second line 812 opposite the first end of second line 812 and the first end of fourth line 816.

First diode 818 is oriented to conduct current in the on-state from first line 810 to fifth line 908. Second diode 820 is oriented to conduct current in the on-state from second line 812 to third line 814. Third diode 822 is oriented to conduct current in the on-state from second line 812 to fourth line 816.

First voltage pad 802 is connected to first line 810. Second voltage pad 804 is connected to the second side of third line 814 adjacent the second end of third line 814. Third voltage pad 806 is connected to second line 812 and may provide a reference voltage. Fourth voltage pad 808 is connected to a corner of fourth line 816.

First line 810, fifth line 908 second line 812, and third line 814 are straight sections of transmission line. Second line 812 and third line 814 are oriented perpendicular to first line 810 and to fifth line 908. The dimensions of first line 810, fifth line 908, second line 812, third line 814, and fourth line 816 are selected to define a specific impedance value based on the frequency of operation of transceiver system 200.

Table 5 below shows a switch state for each phase state provided by third reflecting circuit 104c.

TABLE 5

| Phase state | First diode 818 | Second diode 820 | Third diode 822 | Phase shift |
|---|---|---|---|---|
| 1 | Off | Off | Off | 0° |
| 2 | On | Off | Off | −90° |
| 3 | On | On | Off | 180° |
| 4 | On | Off | On | 90° |

In the first phase state that achieves a phase shift of 0°, the signal enters at I/O port 108 and propagates along first line 810 until the signal reaches first diode 818 that is in the off-state such that the current flow is reflected. Third reflecting circuit 104c provides an open circuit when the signal reaches first diode 818 and reflects substantially all of the signal back towards I/O port 108. The reflection phase may be determined by approximately twice a length of first line 810.

In the second phase state that achieves a phase shift of −90°, the signal enters at I/O port 108 and propagates along first line 810, fifth line 908, and second line 812 until the signal reaches second diode 820 and third diode 822 that are in the off-state such that the current flow is reflected. Third reflecting circuit 104c provides an open circuit when the signal reaches second diode 820 and third diode 822 and reflects substantially all of the signal back towards I/O port 108. The reflection phase may be determined by approximately twice a length of first line 810, fifth line 908, and second line 812.

In the third phase state that achieves a phase shift of 180°, the signal enters at I/O port 108 and propagates along first line 810, fifth line 908, a top portion of second line 812, and third line 814 until the signal reaches an end of third line 814 such that the current flow is reflected. Third reflecting circuit 104c provides an open circuit when the signal reaches the end of third line 814 and reflects substantially all of the signal back towards I/O port 108. The reflection phase may be determined by approximately twice a length of first line 810, fifth line 908, the top portion of second line 812, and third line 814.

In the fourth phase state that achieves a phase shift of 90°, the signal enters at I/O port 108 and propagates along first line 810, fifth line 908, a bottom portion of second line 812, and fourth line 816 until the signal reaches the second end of fourth line 816 such that the current flow is reflected.

Third reflecting circuit 104c provides an open circuit when the signal reaches the second end of fourth line 816 and reflects substantially all of the signal back towards I/O port 108. The reflection phase may be determined by approximately twice a length of first line 810, fifth line 908, a bottom portion of second line 812, and fourth line 816.

If third reflecting circuit 104c is designed to use the two voltage states 0 V and 1 V, the orientation of second diode 820 and of third diode 822 is changed to conduct in the opposite direction. Thus, second diode 820 is oriented to conduct current in the on-state from third line 814 to second line 812, and third diode 822 is oriented to conduct current in the on-state from fourth line 816 to second line 812. Table 6 below shows a voltage applied to each voltage pad for each phase state provided by third reflecting circuit 104c designed to use the two voltage states 0 V and 1 V.

TABLE 6

| Phase state | First voltage pad 802 | Second voltage pad 804 | Third voltage pad 806 | Fourth voltage pad 808 |
| --- | --- | --- | --- | --- |
| 1 | 0 | 0 | 0 | 0 |
| 2 | 1 | 0 | 0 | 0 |
| 3 | 1 | 1 | 0 | 0 |
| 4 | 1 | 0 | 0 | 1 |

Figure 10A:
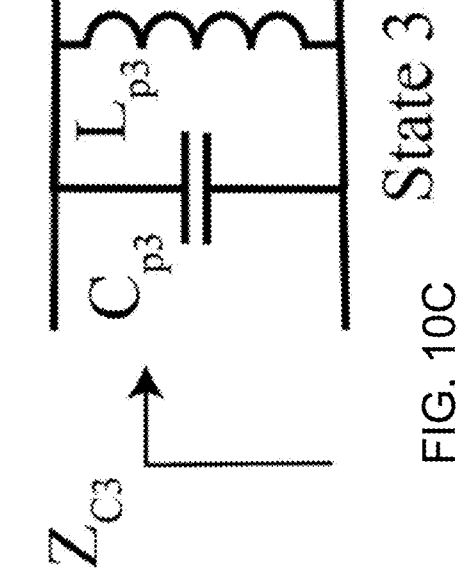
FIGS. 10A through 10D depict a second set of circuit diagrams for four phase states based on the equivalent circuit of FIG. 6 in accordance with an illustrative embodiment.
Figure 10B:
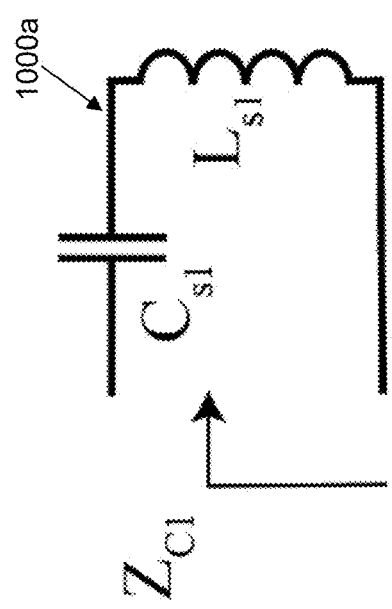
Figure 10C:
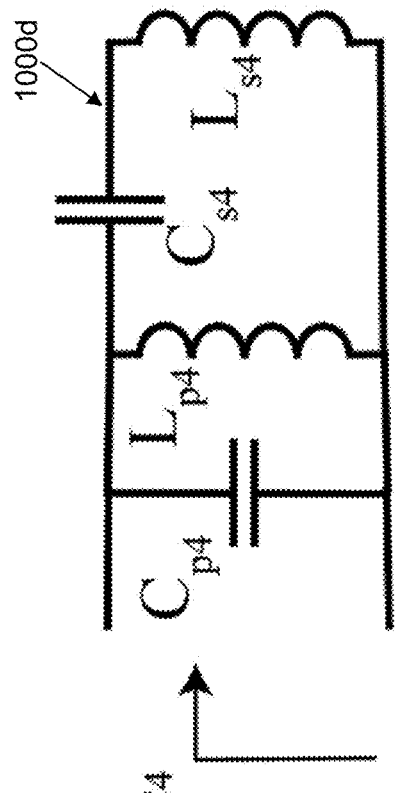
Figure 10D:
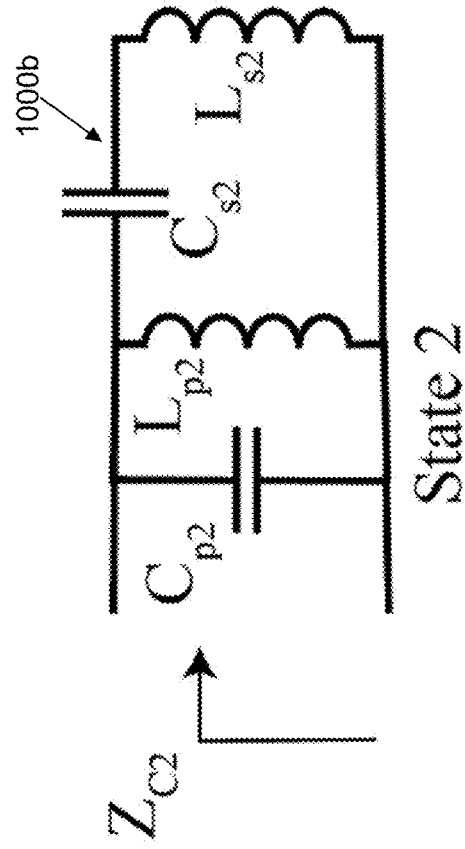

For illustration, referring to FIG. 10A, a first equivalent circuit 1000a for a first phase state is shown in accordance with an illustrative embodiment that results in a 0° phase shift in the reflected signal. Referring to FIG. 10B, a second equivalent circuit 1000b for a second phase state is shown in accordance with an illustrative embodiment that results in a −90° phase shift in the reflected signal. Referring to FIG. 10C, a third equivalent circuit 1000c for a third phase state is shown in accordance with an illustrative embodiment that results in a 180° phase shift in the reflected signal. Referring to FIG. 10D, a fourth equivalent circuit 1000d for a fourth phase state is shown in accordance with an illustrative embodiment that results in a 90° phase shift in the reflected signal.

Figure 11:
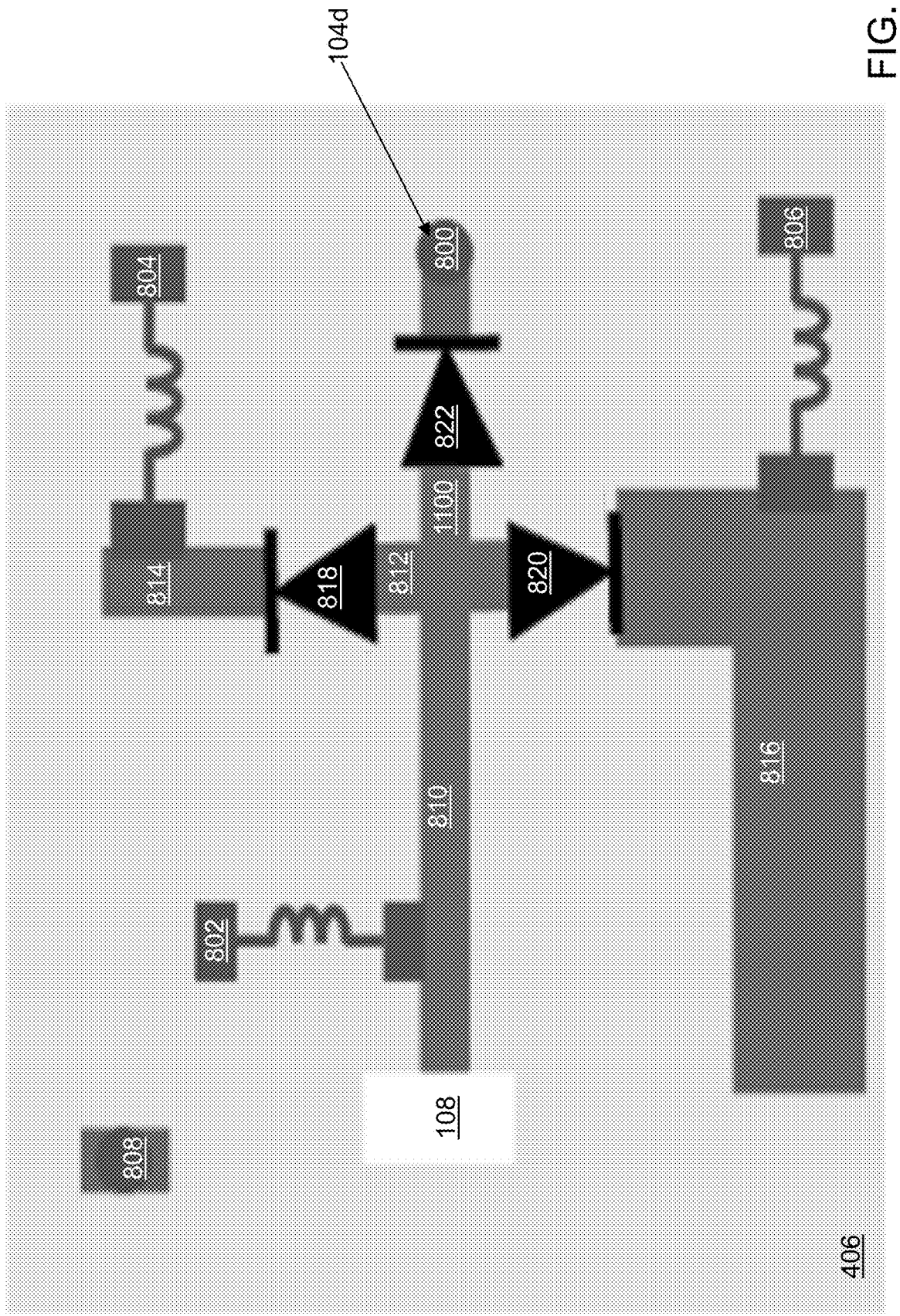
FIG. 11 depicts a fourth 2-bit reflecting circuit on the dielectric layer that is controllable to generate the four phase states of FIGS. 10A through 10D in accordance with an illustrative embodiment.

Referring to FIG. 11, a bottom view of reflector dielectric layer 406 to which a fourth reflecting circuit 104d is mounted is shown in accordance with an illustrative embodiment. Fourth reflecting circuit 104d provides the four equivalent circuit states described by FIGS. 10A-10D. Second 2-bit phase shift element 100b may be modified to replace first reflecting circuit 104a with fourth reflecting circuit 104d. Fourth reflecting circuit 104d may include via 800, first voltage pad 802, second voltage pad 804, third voltage pad 806, fourth voltage pad 808, first line 810, second line 812, third line 814, fourth line 816, sixth line 1100, first diode 818, second diode 820, and third diode 822. Via 800 is again connected to fourth voltage pad 808. Voltages applied to first voltage pad 802, second voltage pad 804, third voltage pad 806, and fourth voltage pad 808 can be controlled to define an on-state (current conducting state) or an off-state (non-current conducting state) of first diode 818, second diode 820, and third diode 822. Via 800, first line 810, second line 812, third line 814, fourth line 816, and sixth line 1100 are sections of transmission line that connect to first diode 818, second diode 820, and third diode 822 and are shaped and sized to provide a specific impedance when current flows on a respective line based on a state of each of first diode 818, second diode 820, and third diode 822. Through use of first diode 818, second diode 820, and third diode 822, via 800, first line 810, second line 812, third line 814, fourth line 816, and sixth line 1100 provide a tunable impedance for the reflection load by controlling a flow of current on each line.

The signal received by antenna 102 is provided to fourth reflecting circuit 104d at I/O port 108 that is connected to the first end of first line 810. Second line 812 is connected to extend in a generally perpendicular direction relative to a second end of first line 810 opposite the first end of first line 810. First diode 818 is connected to a top end of second line 812. Second diode 820 is connected to a bottom end of second line 812 opposite the first end of second line 812. First diode 818 is also connected to a first end of third line 814. Second diode 820 is also connected to a first end of fourth line 816. A first end of sixth line 1100 connects to second line 812 opposite where the second end of first line 810 connects to second line 812. Third diode 822 is connected to a second end of sixth line 1100 opposite the first end of sixth line 1100. Third diode 822 is also connected to via 800.

First diode 818 is oriented to conduct current in the on-state from second line 812 to third line 814. Second diode 820 is oriented to conduct current in the on-state from second line 812 to fourth line 816. Third diode 822 is oriented to conduct current in the on-state from sixth line 1100 to via 800.

First voltage pad 802 is connected to first line 810 and may provide a reference voltage. Second voltage pad 804 is connected to the second side of third line 814 adjacent the second end of third line 814. Third voltage pad 806 is connected to the corner of fourth line 816. Fourth voltage pad 808 is connected to via 800 and mounted near the upper left corner of reflector dielectric layer 406.

First line 810, second line 812, third line 814, and sixth line 1100 are straight sections of transmission line. Second line 812 and third line 814 are oriented perpendicular to first line 810 and sixth line 1100. Fourth line 816 is the L-shaped section of transmission line. The dimensions of via 800, first line 810, second line 812, third line 814, fourth line 816, and sixth line 1100 are selected to define a specific impedance value based on the frequency of operation of transceiver system 200.

Table 7 below shows a switch state for each phase state provided by first reflecting circuit 104a.

TABLE 7

| Phase state | First diode 818 | Second diode 820 | Third diode 822 | Phase shift |
| --- | --- | --- | --- | --- |
| 1 | Off | Off | Off | 0° |
| 2 | On | Off | Off | −90° |
| 3 | Off | Off | On | 180° |
| 4 | Off | On | Off | 90° |

In the first phase state that achieves a phase shift of 0°, the signal enters at I/O port 108 and propagates along first line 810, second line 812, and sixth line 1100 until the signal reaches first diode 818, second diode 820, and third diode 822 that are in the off-state such that the current flow is reflected. Fourth reflecting circuit 104d provides an open circuit when the signal reaches first diode 818, second diode 820, and third diode 822 and reflects substantially all of the signal back towards I/O port 108. The reflection phase may be determined by approximately twice a length of first line 810, second line 812, and sixth line 1100.

In the second phase state that achieves a phase shift of −90°, the signal enters at I/O port 108 and propagates along first line 810, the top portion of second line 812, and third line 814 until the signal reaches the second end of third line 814 such that the current flow is reflected. Fourth reflecting circuit 104d provides an open circuit when the signal reaches the second end of third line 814 and reflects substantially all of the signal back towards I/O port 108. The reflection phase may be determined by approximately twice a length of first line 810, the top portion of second line 812, and third line 814.

In the third phase state that achieves a phase shift of 180°, the signal enters at I/O port 108 and propagates along first line 810 and sixth line 1100 until the signal reaches via 800 that is short circuited to ground plane 404 such that the current flow is reflected. Fourth reflecting circuit 104d provides a short circuit when the signal reaches via 800 and reflects substantially all of the signal back towards I/O port 108. The reflection phase may be determined by approximately twice a length of first line 810, sixth line 1100, and second line 812 and the 180° phase shift that results when the signal reaches via 800.

In the fourth phase state that achieves a phase shift of 90°, the signal enters at I/O port 108 and propagates along first line 810, the bottom portion of second line 812, and fourth line 816 until the signal reaches an end of fourth line 816 such that the current flow is reflected. Fourth reflecting circuit 104d provides an open circuit when the signal reaches the end of fourth line 816 and reflects substantially all of the signal back towards I/O port 108. The reflection phase may be determined by approximately twice a length of first line 810, the bottom portion of second line 812, and fourth line 816.

If fourth reflecting circuit 104d is designed to use the two voltage states 0 V and 1 V, the orientation of first diode 818, of second diode 820, and third diode 822 is changed to conduct in the opposite direction. Thus, first diode 818 is oriented to conduct current in the on-state from third line 814 to second line 812, second diode 820 is oriented to conduct current in the on-state from fourth line 816 to second line 812, and third diode 822 is oriented to conduct current in the on-state from via 800 to sixth line 1100. Table 8 below shows a voltage applied to each voltage pad for each phase state provided by fourth reflecting circuit 104d designed to use the two voltage states 0 V and 1 V.

TABLE 8

| Phase state | First voltage pad 802 | Second voltage pad 804 | Third voltage pad 806 | Fourth voltage pad 808 |
|---|---|---|---|---|
| 1 | 0 | 0 | 0 | 0 |
| 2 | 0 | 1 | 0 | 0 |
| 3 | 0 | 0 | 0 | 1 |
| 4 | 0 | 0 | 1 | 0 |

Second 2-bit phase shift element 100b with first reflecting circuit 104a was simulated using the unit cell boundary condition. First diode 818, second diode 820, and third diode 822 had forward resistance of 2.4 Ohm and a reverse capacitance of 0.078 picofarad. Second antenna dielectric layer 500 was Rogers 5880 laminate that was 31 millimeters thick. First conducting pattern layer 402 and second conducting pattern layer 403 were each formed of a multilayer aluminum nitride material with a permittivity of 8.1, a loss tangent of 0.003, and a thickness of 25 mm. Second 2-bit phase shift element 100b was illuminated by an incident wave with polarization in the x-direction.

Figure 13:
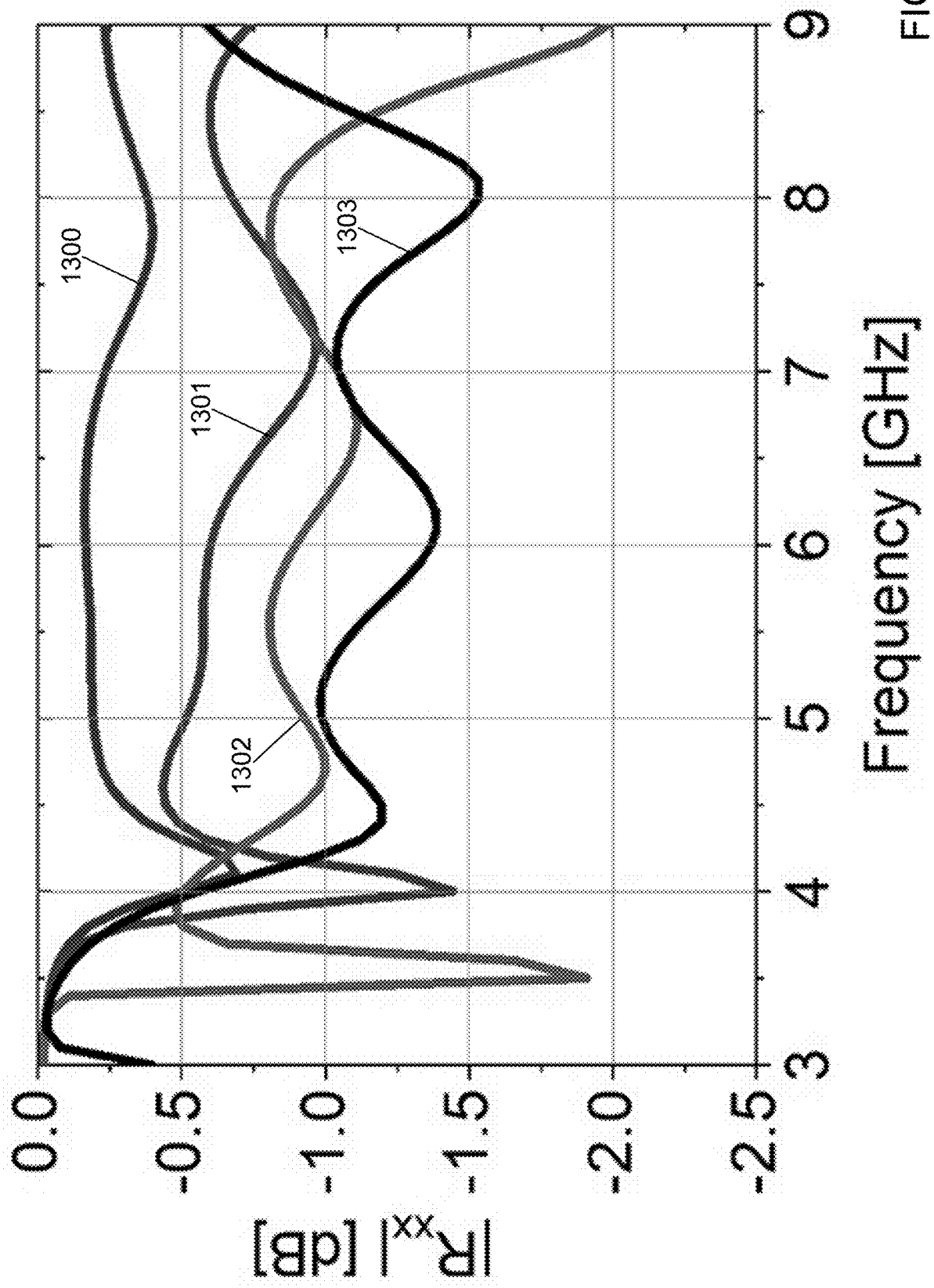
FIG. 13 shows a simulated reflection coefficient as a function of frequency generated in a direction of polarization of an incident wave by the 2-bit phase shift element of FIG. 8 for each of the four phase states of FIGS. 7A through 7D in accordance with an illustrative embodiment.

Referring to FIG. 13, a simulated magnitude of a reflection coefficient in the x-direction as a function of frequency is shown for each of the four phase states in accordance with an illustrative embodiment. A first curve 1300 shows the reflection coefficient for the first phase state. A second curve 1301 shows the reflection coefficient for the second phase state. A third curve 1302 shows the reflection coefficient for the third phase state. A fourth curve 1303 shows the reflection coefficient for the fourth phase state. The reflection coefficient in the x-direction for all four phase states was better than −1.5 decibels (dB) from 4 GHz to 8.6 GHz, which results in a loss with a reasonable value of 0.75 dB/bit.

Figure 14:
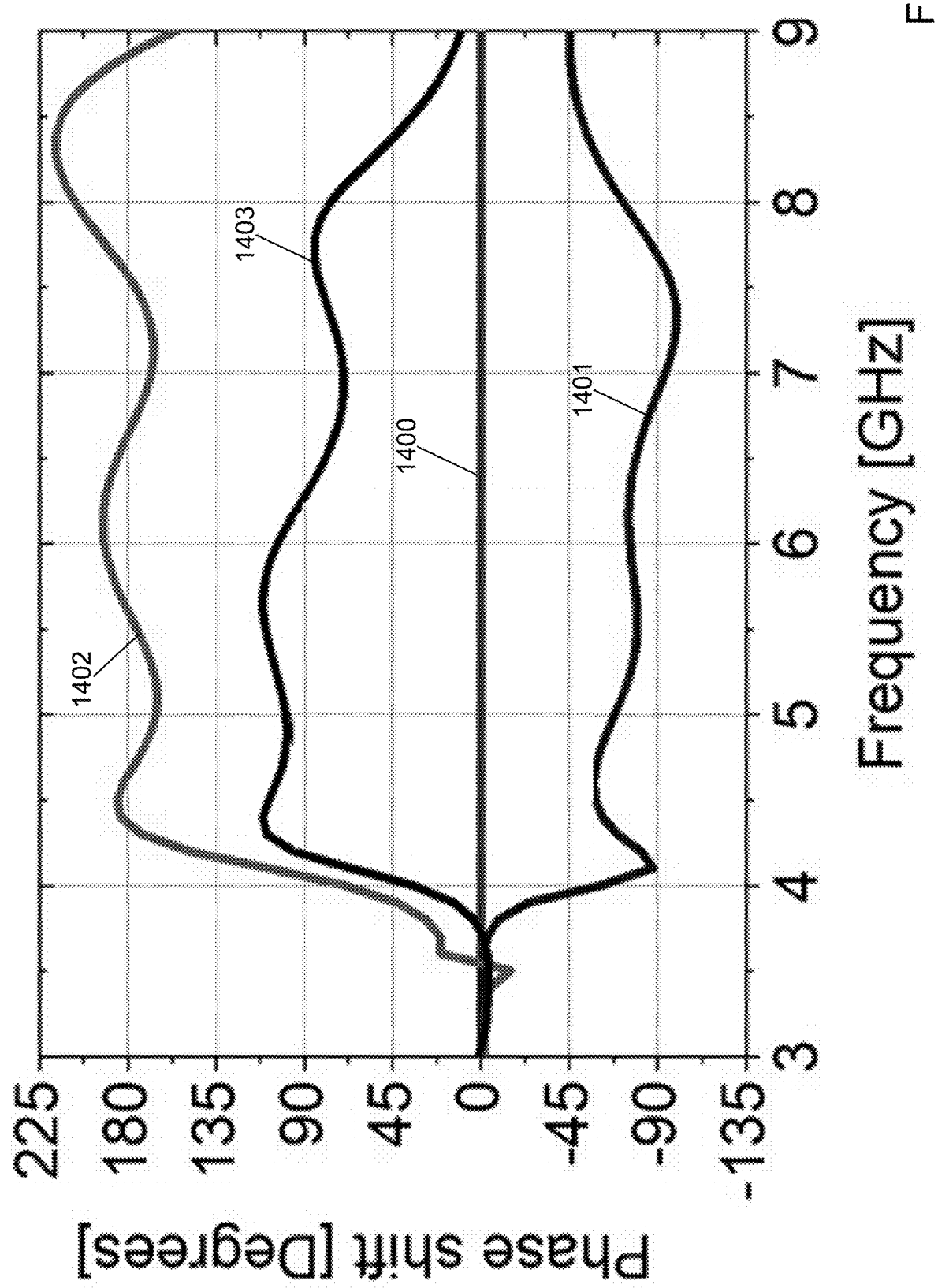
FIG. 14 shows a simulated phase shift as a function of frequency generated by the 2-bit phase shift element of FIG. 8 for each of the four phase states of FIGS. 7A through 7D in accordance with an illustrative embodiment.

Referring to FIG. 14, a simulated phase shift as a function of frequency is shown for each of the four phase states in accordance with an illustrative embodiment. A phase shift first curve 1400 shows the phase shift for the first phase state. A phase shift second curve 1401 shows the phase shift for the second phase state. A phase shift third curve 1402 shows the phase shift for the third phase state. A phase shift fourth curve 1403 shows the phase shift for the fourth phase state. The phase difference between all four phase states had a phase error of ±20° over 5-7.9 GHz, which gives a bandwidth of 45% that is wider than that of other 2-bit reflectarray unit-cells.

As used herein, the term "mount" includes join, unite, connect, couple, associate, insert, hang, hold, affix, attach, fasten, bind, paste, secure, bolt, screw, rivet, solder, weld, glue, form over, form in, layer, mold, rest on, rest against, etch, abut, and other like terms. The phrases "mounted on", "mounted to", and equivalent phrases indicate any interior or exterior portion of the element referenced. These phrases also encompass direct mounting (in which the referenced elements are in direct contact) and indirect mounting (in which the referenced elements are not in direct contact, but are connected through an intermediate element). Elements referenced as mounted to each other herein may further be integrally formed together, for example, using a molding or a thermoforming process as understood by a person of skill in the art. As a result, elements described herein as being mounted to each other need not be discrete structural elements. The elements may be mounted permanently, removably, or releasably unless specified otherwise.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, using "and" or "or" in the detailed description is intended to include "and/or" unless specifically indicated otherwise. The illustrative embodiments may be implemented as a method, apparatus, or article of manufacture using standard programming and/or engineering techniques to produce software, firmware, hardware, or any combination thereof to control a computer to implement the disclosed embodiments.

Any directional references used herein, such as left-side, right-side, top, bottom, back, front, up, down, above, below, etc., are for illustration only based on the orientation in the drawings selected to describe the illustrative embodiments.

The foregoing description of illustrative embodiments of the disclosed subject matter has been presented for purposes of illustration and of description. It is not intended to be exhaustive or to limit the disclosed subject matter to the precise form disclosed, and modifications and variations are possible in light of the above teachings or may be acquired from practice of the disclosed subject matter. The embodiments were chosen and described in order to explain the principles of the disclosed subject matter and as practical applications of the disclosed subject matter to enable one skilled in the art to utilize the disclosed subject matter in various embodiments and with various modifications as suited to the particular use contemplated.

What is claimed is:

1. A phase shift element comprising:
   an antenna;
   a first dielectric layer;
   a ground plane mounted to a first surface of the first dielectric layer;
   a reflecting circuit mounted to a second surface of the first dielectric layer, wherein the first surface is opposite the second surface; and
   a single antenna-reflector line connected between the antenna and the reflecting circuit through the ground plane and the first dielectric layer, wherein the antenna-reflector line is formed of a conducting material,
   wherein the reflecting circuit is configured to reflect a signal received on the single antenna-reflector line from the antenna back to the antenna on the single antenna-reflector line;
   wherein the reflecting circuit is further configured to be switchable between four different phase shifts when the signal is reflected by the reflecting circuit;
   wherein each of the four different phase shifts is associated with a different impedance value of the reflecting circuit; and
   wherein the reflecting circuit controls the impedance value by changing a switch state of a plurality of diodes to switch between the four different phase shifts.

2. The phase shift element of claim 1, further comprising an interconnect line connected between the antenna and the ground plane, wherein the interconnect line is formed of a conducting material.

3. The phase shift element of claim 2, wherein the antenna is a patch antenna.

4. The phase shift element of claim 3, wherein the patch antenna comprises:
   a conducting sheet; and
   a second dielectric layer mounted between the conducting sheet and a side of the ground plane that is opposite the first dielectric layer,
   wherein the single antenna-reflector line is connected between the conducting sheet and the reflecting circuit through the second dielectric layer, the ground plane, and the first dielectric layer.

5. The phase shift element of claim 4, wherein an interconnect line is connected to a center of the conducting sheet.

6. The phase shift element of claim 4, wherein a first surface of the conducting sheet, the first surface of the first dielectric layer, a first surface of the ground plane mounted to the first surface of the first dielectric layer, and a first surface of the second dielectric layer mounted to the first surface of the conducting sheet are parallel to each other.

7. The phase shift element of claim 4, wherein a first surface of the conducting sheet is mounted to a first surface of the second dielectric layer, wherein a second surface of the second dielectric layer that is opposite to the first surface of the second dielectric layer is mounted to a first surface of the ground plane, wherein a second surface of the ground plane that is opposite to the first surface of the ground plane is mounted to the first surface of the first dielectric layer.

8. The phase shift element of claim 1, wherein the antenna is a dipole antenna.

9. The phase shift element of claim 8, wherein the dipole antenna comprises:
   a second dielectric layer;
   a first conducting pattern mounted on a first surface of the second dielectric layer; and
   a second conducting pattern mounted on a second surface of the second dielectric layer that is opposite to the first surface of the second dielectric layer.

10. The phase shift element of claim 9, wherein the single antenna-reflector line is connected between the second conducting pattern and the reflecting circuit through the ground plane and the first dielectric layer.

11. The phase shift element of claim 9, further comprising an interconnect line connected between the second conducting pattern and the ground plane, wherein the interconnect line is formed at least partially on the second surface of the second dielectric layer, wherein the interconnect line is formed of a conducting material.

12. The phase shift element of claim 9, wherein a first plane defined by the first surface of the second dielectric layer is perpendicular to a second plane defined by the first surface of the first dielectric layer.

13. The phase shift element of claim 9, wherein a first plane defined by the first surface of the second dielectric layer is perpendicular to a second plane defined by the first surface of the first dielectric layer and to a second plane defined by the first surface of the ground plane.

14. The phase shift element of claim 9, wherein the first conducting pattern and the second conducting pattern are different.

15. The phase shift element of claim 1, wherein the reflecting circuit comprises:
   a first transmission line section;
   a second transmission line section;
   a third transmission line section;
   a fourth transmission line section; and
   a single pole, four throw switch, wherein each transmission line section is connected to a different throw of the single pole, four throw switch to each provide the impedance value associated with each of the four different phase shifts when the signal is reflected by the reflecting circuit.

16. The phase shift element of claim 1, wherein the reflecting circuit comprises:
   a first transmission line section;
   a second transmission line section;
   a third transmission line section;
   a fourth transmission line section;
   a first single pole, single throw switch connected between two transmission line sections of the first transmission line section, the second transmission line section, the third transmission line section, and the fourth transmission line section;
   a second single pole, single throw switch connected between two transmission line sections of the first transmission line section, the second transmission line section, the third transmission line section, and the fourth transmission line section; and
   a third single pole, single throw switch connected between two transmission line sections of the first transmission line section, the second transmission line section, the third transmission line section, and the fourth transmission line section;
   wherein the impedance value associated with each of the four different phase shifts is defined based on which transmission line sections are connected.

17. The phase shift element of claim 16, wherein the first single pole, single throw switch is a first diode of the plurality of diodes, wherein the second single pole, single throw switch is a second diode of the plurality of diodes, wherein the third single pole, single throw switch is a third diode of the plurality of diodes, and wherein the fourth single pole, single throw switch is a fourth diode of the plurality of diodes.

18. The phase shift element of claim 17, wherein the reflecting circuit further comprises:
 a first voltage pad connected to the first transmission line section;
 a second voltage pad connected to the second transmission line section;
 a third voltage pad connected to the third transmission line section; and
 a fourth voltage pad connected to the fourth transmission line section,
 wherein a difference between voltages applied to the first voltage pad, the second voltage pad, the third voltage pad, and the first voltage pad controls a state of the first diode, the second diode, and the third diode to connect the two transmission line sections of the first transmission line section, the second transmission line section, the third transmission line section, and the fourth transmission line section.

19. The phase shift element of claim 16, wherein the first transmission line section is connected between the single antenna-reflector line and the first single pole, single throw switch.

20. A phased array antenna comprising:
 a plurality of phase shift elements, wherein each phase shift element of the plurality of phase shift elements comprises
 an antenna;
 a first dielectric layer;
 a ground plane mounted to a first surface of the first dielectric layer;
 a reflecting circuit mounted to a second surface of the first dielectric layer, wherein the first surface is opposite the second surface; and
 a single antenna-reflector line connected between the antenna and the reflecting circuit through the ground plane and the first dielectric layer, wherein the antenna-reflector line is formed of a conducting material,
 wherein the reflecting circuit is configured to reflect a signal received on the single antenna-reflector line from the antenna back to the antenna on the single antenna-reflector line;
 wherein the reflecting circuit is further configured to be switchable between four different phase shifts when the signal is reflected by the reflecting circuit;
 wherein each of the four different phase shifts is associated with a different impedance value of the reflecting circuit; and
 wherein the reflecting circuit controls the impedance value by changing a switch state of a plurality of diodes to switch between the four different phase shifts.

\* \* \* \* \*